(12) United States Patent
Sumiyoshi et al.

(10) Patent No.: US 12,278,102 B2
(45) Date of Patent: Apr. 15, 2025

(54) SEMICONDUCTOR DEVICE WITH SILICON NITRIDE PASSIVATION FILM

(71) Applicant: SUMITOMO ELECTRIC INDUSTRIES, LTD., Osaka (JP)

(72) Inventors: Kazuhide Sumiyoshi, Osaka (JP); Masaya Okada, Osaka (JP); Kazutaka Inoue, Osaka (JP); Takumi Yonemura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 56 days.

(21) Appl. No.: 17/959,865

(22) Filed: Oct. 4, 2022

(65) Prior Publication Data

US 2023/0054259 A1 Feb. 23, 2023

Related U.S. Application Data

(62) Division of application No. 17/011,728, filed on Sep. 3, 2020, now abandoned.

(30) Foreign Application Priority Data

Sep. 4, 2019 (JP) ................................. 2019-161282
Jul. 2, 2020 (JP) ................................. 2020-115056

(51) Int. Cl.
*H01L 21/02* (2006.01)
*H01L 29/20* (2006.01)
(Continued)

(52) U.S. Cl.
CPC .... *H01L 21/0217* (2013.01); *H01L 21/02271* (2013.01); *H01L 21/0254* (2013.01);
(Continued)

(58) Field of Classification Search
CPC ........... H01L 21/0217; H01L 21/02271; H01L 21/0254; H01L 29/2003; H01L 29/66462; H01L 29/778; H01L 29/41766; H01L 29/7787; H01L 21/56; H01L 23/3171; H01L 29/7781; C23C 16/345
See application file for complete search history.

(56) References Cited

U.S. PATENT DOCUMENTS 5,976,990 A 11/1999 Mercaldi
2002/0086541 A1 7/2002 Fu
(Continued)

FOREIGN PATENT DOCUMENTS

JP 2007-150106 6/2007
JP 2018-181885 11/2018

*Primary Examiner* — Julia Slutsker
(74) *Attorney, Agent, or Firm* — Smith, Gambrell & Russell, LLP

(57) ABSTRACT

A semiconductor device includes a substrate, a semiconductor stacking portion formed on the substrate, a silicon nitride passivation film covering the surface of the semiconductor stacking portion, and oxygen atoms existing at an interface between the silicon nitride passivation film and the semiconductor stacking portion. The semiconductor stacking portion includes a plurality of nitride semiconductor layers. The interfacial oxygen content at the passivation film and stacking portion interface is $0.6\times10^{15}$ oxygen atoms/cm$^2$ or less.

4 Claims, 24 Drawing Sheets

(51) Int. Cl.
*H01L 29/66* (2006.01)
*H01L 29/778* (2006.01)

(52) U.S. Cl.
CPC .... *H01L 29/2003* (2013.01); *H01L 29/66462* (2013.01); *H01L 29/778* (2013.01)

(56) References Cited

U.S. PATENT DOCUMENTS

| | | | |
|---|---|---|---|
| 2004/0191151 A1* | 9/2004 | Kouvetakis | H01L 21/02271 423/326 |
| 2013/0306978 A1* | 11/2013 | Chen | H01L 21/02381 438/478 |
| 2018/0286661 A1 | 10/2018 | Sumiyoshi | |
| 2020/0388546 A1 | 12/2020 | Horikiri | |
| 2021/0104395 A1 | 4/2021 | Yamamura | |

* cited by examiner

SEMICONDUCTOR DEVICE WITH SILICON NITRIDE PASSIVATION FILM

CROSS-REFERENCE TO RELATED APPLICATIONS

This application claims the benefit of priority from U.S. application Ser. No. 17/011,728 filed on Sep. 3, 2020, which application claims the benefit of priority from Japanese Patent Applications No. 2019-161282 filed on Sep. 4, 2019 and No. 2020-115056 filed on Jul. 2, 2020, the entire contents of which are incorporated herein by reference.

BACKGROUND

The present disclosure relates to a method of forming a silicon nitride passivation film, a method of manufacturing a semiconductor device, and a semiconductor device.

Japanese unexamined Patent Application publication No. 2018-181885 discloses a technique relating to the production of a high-electron mobility transistor (HEMT) as a semiconductor device using a nitride semiconductor. A HEMT described in Japanese unexamined Patent Application publication No. 2018-181885 includes a nitride semiconductor layer on a substrate such as SiC (Silicon Carbide), and a silicon nitride passivation film formed on the surface of the nitride semiconductor layer. The silicon nitride passivation film is formed by a low-pressure chemical vapor deposition (CVD) method.

SUMMARY

Recently, a semiconductor device using a nitride semiconductor such as, for example, Gallium nitride (GaN) based semiconductor has been developed. In the semiconductor device, although an insulating silicon compound film is provided to protect and passivate the outermost surface of the semiconductor, in a case of a semiconductor device using a nitride semiconductor, silicon nitride (SiN) film which is the same kind of nitride is often used. When a silicon nitride film on a nitride semiconductor is formed, in order to form the film at a relatively low temperature, a film forming method using a plasma (plasma CVD, electron cyclotron resonance (ECR) sputtering or the like) is used. Therefore, damage due to plasma is formed on the surface of the nitride semiconductor.

On the other hand, when a silicon nitride film on a silicon semiconductor is formed, a low pressure (LP) CVD method is used. According to the LP CVD method, a high-quality film can be formed by increasing the film forming temperature instead of decreasing the film forming pressure. Therefore, according to the LP CVD method, damage due to plasma to the silicon semiconductor which is underlying is suppressed. The inventors considered that if it is possible to use a LP CVD method also in a silicon nitride film on a nitride semiconductor, without giving damage due to plasma to the surface of the nitride semiconductor, it is possible to suitably form the silicon nitride film.

When a silicon nitride film is formed by a LP CVD method, an oxide film is formed by exposing the surface of the epitaxial wafer to an atmosphere during a standby period after epitaxial growth. In addition, it is also conceivable that an oxide layer (e.g., a gallium oxide layer, an aluminum oxide layer, an indium oxide layer, or the like) is formed on the surface of the nitride semiconductor by the presence of moisture and oxygen due to degassing in a reaction furnace under a high temperature environment. The oxygen from the oxide film and the oxide layer of the interface between the nitride semiconductor and the silicon nitride film thus obtained, could deteriorate the operating characteristics of the semiconductor device.

Incidentally, in the general LP CVD technique used and matured in the forming of the silicon nitride film on the silicon semiconductor, consideration on the oxygen at the interface between the silicon semiconductor and the silicon nitride film has not been required. The reason is that in the forming of the silicon nitride film on the silicon semiconductor, it is possible to remove the oxide film formed on the surface of the silicon semiconductor by a simple method because of the property of the silicon.

According to the finding of the inventors, when applying the LP CVD method to the deposition of the silicon nitride film on the nitride semiconductor, if not reducing the interfacial oxygen content at the interface between the nitride semiconductor and the silicon nitride film, the oxygen at the interface affects the operating characteristics of the semiconductor device. For example, in the vicinity of the interface where the gate edge electric field is concentrated, the poor quality oxide film is formed by degassing, the leakage current is increased, electrical characteristics deteriorate.

However, in a general LP CVD method, it is difficult to completely eliminate the desorption gas (here, moisture and oxygen) in order to reduce the amount of oxygen at the interface from the viewpoint of the mechanism of the apparatus. This is because there is the degassing from the epitaxial wafer itself which is a film forming sample. Further, it is difficult to control all the members of the film forming reaction furnace inside the apparatus so as not to be exposed to the air.

The present disclosure has been made in view of such problems, when a silicon nitride passivation film on a nitride semiconductor is formed by a LP CVD method, a method of forming the silicon nitride passivation film that can reduce the amount of oxygen at the interface between the nitride semiconductor and the silicon nitride passivation film is provided. And a method of manufacturing a semiconductor device using the silicon nitride passivation film is provided. And a semiconductor device capable of suppressing a deterioration in electrical characteristics is provided.

In order to solve the above-described problems, a method of forming a silicon nitride passivation film according to an embodiment includes a method of forming a silicon nitride passivation film on a nitride semiconductor layer is comprising steps of, introducing a substrate including the nitride semiconductor layer into a reaction furnace, replacing an atmosphere in the reaction furnace from air to an ammonia ($NH_3$) atmosphere or to a hydrogen ($H_2$) atmosphere, raising a temperature in the reaction furnace to a first temperature, maintaining both the temperature in the reaction furnace at the first temperature and the atmosphere in the reaction furnace at the $NH_3$ atmosphere or the $H_2$ atmosphere for three minutes or more, lowering the temperature in the reaction furnace to a second temperature lower than the first temperature, and forming the silicon nitride passivation film by supplying dichlorosilane ($SiH_2Cl_2$) into the reaction furnace under the first pressure of 100 Pa or less in the reaction furnace.

Further, the semiconductor device according to another embodiment includes a substrate, a semiconductor stacking portion formed on the substrate, which includes a plurality of nitride semiconductor layers, a silicon nitride passivation film covering the surface of the semiconductor stacking portion, and oxygen atoms existing at an interface between the silicon nitride passivation film and the semiconductor stacking portion, wherein the interfacial oxygen content of the oxygen atoms is in $0.6 \times 10^{15}$ atom/cm$^2$ or less.

According to the method of manufacturing a film forming method and a semiconductor device of the silicon nitride passivation film according to the present disclosure, when a silicon nitride passivation film on a nitride semiconductor is formed by a LP CVD method, the nitride semiconductor and the silicon nitride passivation film it is possible to reduce the amount of oxygen at the interface. Further, according to the semiconductor device according to the present disclosure, it is possible to suppress a decrease in electrical characteristics.

BRIEF DESCRIPTION OF THE DRAWINGS

The foregoing and other purposes, aspects, and advantages will be better understood from the following detailed description of embodiments of the disclosure with reference to the drawings, in which.

DETAILED DESCRIPTION

First Embodiment

Figure 1:
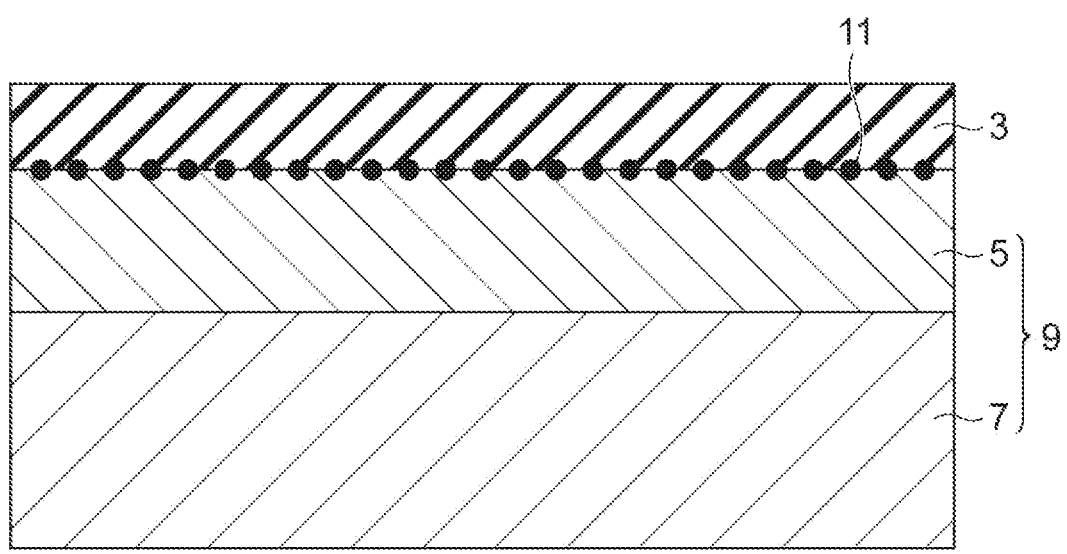
FIG. 1 is a side view showing a silicon nitride passivation film formed by a film forming method according to a first embodiment.

Specific examples of a method of forming a silicon nitride passivation film, a method of manufacturing a semiconductor device, and a semiconductor device according to an embodiment of the present disclosure are described below with reference to the drawings. It should be noted that the present disclosure is not limited to these examples, but is indicated by the claims, and it is intended to include all modifications within the meaning and range equivalent to the claims. In the following description, in the description of the drawings, the same elements are denoted by the same reference numerals, and a repetitive description is omitted.

FIG. 1 is a side view showing a silicon nitride passivation film formed by the film forming method according to the first embodiment of the present disclosure. The silicon nitride passivation film 3 on the surface of the nitride semiconductor layer 5 is formed by a LP CVD method. A nitride semiconductor layer 5, for example, a GaN layer is a layer formed on a substrate 7 such as SiC. The nitride semiconductor layer 5 and the substrate 7 constitute an epitaxial wafer 9. At the interface between the epitaxial wafer 9 and the silicon nitride passivation film 3, oxygen atoms 11 are present. In this specification, a unit of atom/cm$^2$ (atomic numbers per cm$^2$) is used to represent the amount of oxygen at this interface (hereinafter referred to as an interfacial oxygen content). Incidentally, the interfacial oxygen content, based on the distribution of the oxygen concentration in the depth direction by SIMS analysis, is a value evaluating the amount of oxygen at the interface between the epitaxial wafer 9 and the silicon nitride passivation film 3. Specifically, SIMS analysis is performed after completing the series of flows forming the silicon nitride passivation film 3 by the LP CVD method. In the interface between the epitaxial wafer 9 and the silicon nitride passivation film 3 shown in FIG. 1, oxygen atoms 11 exist at an interfacial oxygen content of, for example, $0.16 \times 10^{15}$ atom/cm$^2$ or less.

Figure 2:
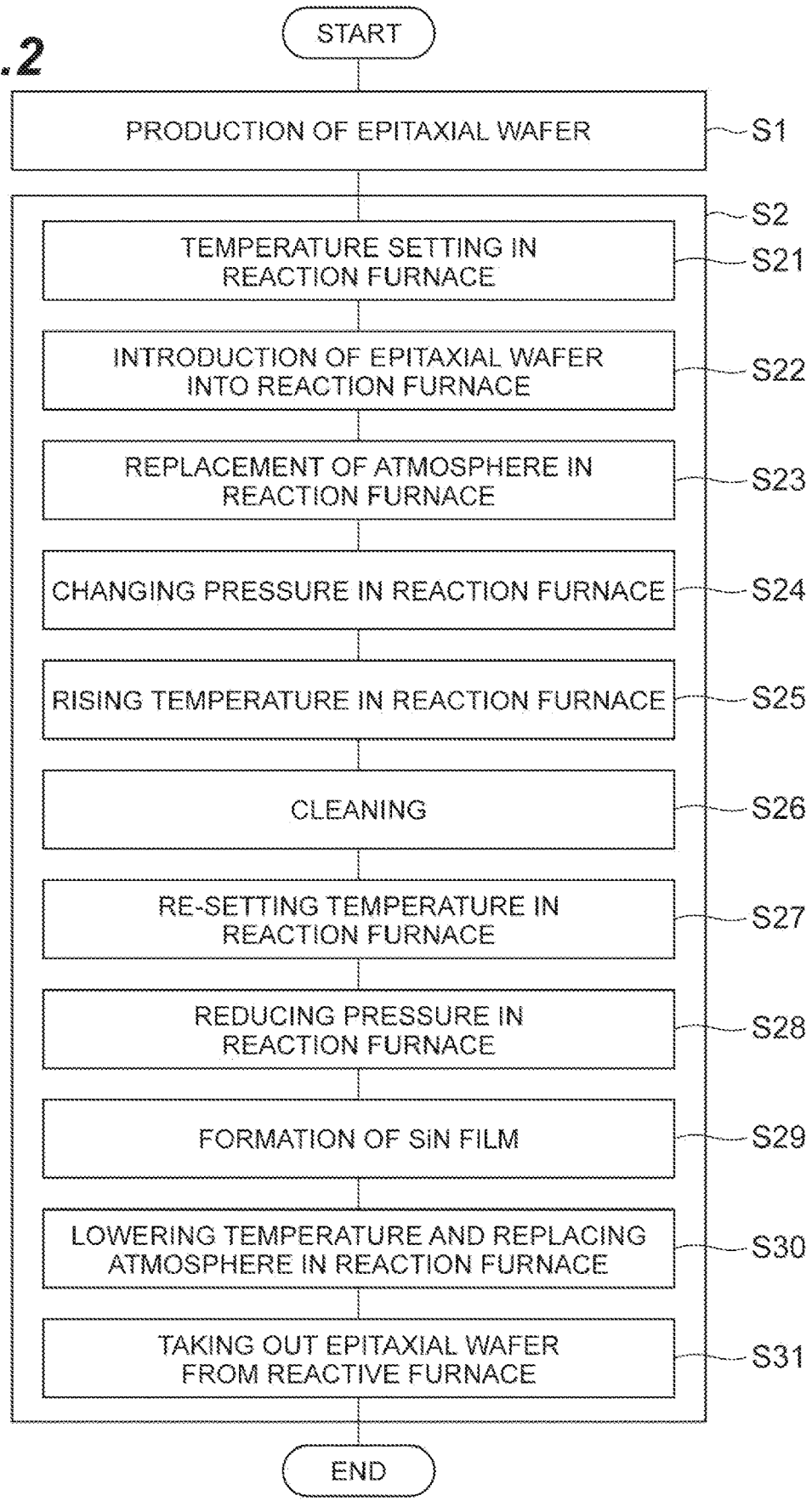
FIG. 2 is a flowchart showing a method of forming a silicon nitride passivation film according to the first embodiment.
Figure 3:
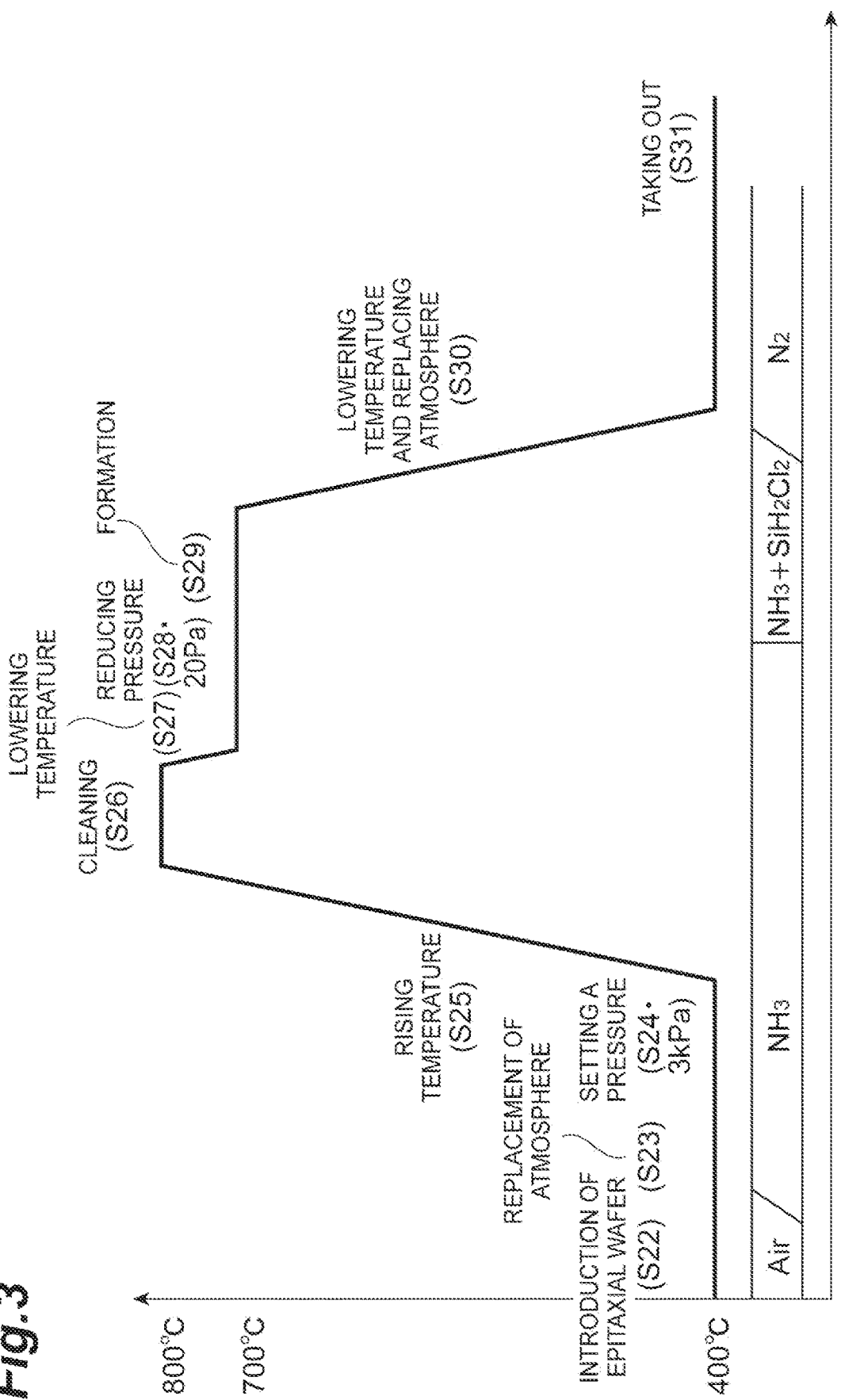
FIG. 3 is a diagram showing a control procedure of a temperature and a supply gas in a reaction furnace when a silicon nitride passivation film is formed.

FIG. 2 is a flowchart showing a method of forming a silicon nitride passivation film 3 according to the present embodiment. First, by a MOCVD (Metal Organic Chemical Vapor Deposition) method, a nitride semiconductor layer 5 is formed on the substrate 7, to produce an epitaxial wafer 9 (step S1). Next, by the LP CVD method, the silicon nitride passivation film 3 is formed on the nitride semiconductor layer 5 (step S2). Details of this step S2 are described with reference to FIGS. 2 and 3. FIG. 3 is a diagram showing a control procedure of a temperature and a supply gas in a reaction furnace when the silicon nitride passivation film 3 is formed.

First, the temperature in the reaction furnace is set to 500° C. or lower in step S21. This temperature may be 400° C. or less, or may be 300° C. or less. Further, this temperature may be equal to or higher than room temperature (25° C.). In one embodiment, the temperature set in step S21 is 400° C. After the temperature in the reaction furnace is stabilized at a set temperature, the epitaxial wafer 9 including the nitride semiconductor layer 5 is set in a carrier in the atmospheric atmosphere, and introduced into the reaction furnace (step S22). Next, by repeating the vacuum purge and the $NH_3$ purge in the reaction furnace (the cycle purge), the atmosphere in the reaction furnace is replaced with the atmosphere including $NH_3$ (step S23). In one embodiment, it is replaced by the $NH_3$ atmosphere. Incidentally, in step S23, the atmosphere in the reaction furnaces may be replaced with a mixed atmosphere of $NH_3$ and $N_2$ which the $NH_3$ partial pressure is 0.1 or more.

After the cycle purge is completed, the pressure in the reaction furnace is changed to a second pressure higher than a film forming pressure (a first pressure described later) (step S24). This second pressure may be greater than or equal to 300 Pa, may be greater than or equal to 5 k Pa, or may be greater than or equal to 10 k Pa. Further, this second pressure may be at or below the atmospheric pressure (100$k$ Pa). In one embodiment, the second pressure is 3 k Pa. Then, while the pressure in the reaction furnace is maintained at the second pressure, the temperature in the reaction furnace is raised to a first temperature higher than 700° C. (step S25, the temperature raising step). The first temperature is higher than a film forming temperature (a second temperature (to be described later)). The first temperature may be a temperature greater than or equal to 20° C. than the second temperature. Further, the first temperature may be 800° C. or higher, also may be 900° C. or less. In one example, the first temperature is 800° C.

Subsequently, the temperature in the reaction furnace is maintained at the first temperature (here, 800° C.), an atmosphere containing $NH_3$ (here, a $NH_3$ atmosphere), and a second pressure (here, 3 k Pa) for 3 minutes or more (step S26, a cleaning step; a maintaining step). In one embodiment, the retention time is 10 minutes. Note that the holding time may be 2 minutes or more. The inside of the reaction furnace is cleaned by performing step S26. Next, a film forming environment is prepared, i.e., a temperature lowering step. Specifically, the following steps S27 and S28 are performed. First, in step S27, the temperature in the reaction furnace is lowered to the second temperature for the film forming. However, the second temperature is a temperature lower than the first temperature. The second temperature may be 700° C. or higher. In one example, the second temperature is 780° C. After the temperature in the reaction furnace is stabilized to the second temperature, the pressure in the reaction furnace is reduced to a first pressure of 100 Pa or less in step S28. This first pressure may be 40 Pa or less, and may also be 10 Pa or more. In one embodiment, the first pressure is 20 Pa.

Then, dichlorosilane ($SiH_2Cl_2$) is supplied into the reaction furnace at the first pressure (here, 20 Pa) in the reaction furnace to form the silicon nitride passivation film 3 (step S29). In step S29, the $NH_3$ flow rate and the dichlorosilane flow rate may be substantially equal to each other. The $NH_3$ flow rate and the dichlorosilane flow rate are both 100 sccm, for example. 1 sccm represents the flow of 1 $cm^3$ per a minute at 0° C. and 1 atm.

After the forming of the silicon nitride passivation film 3 is completed, the supplying of the source gas is stopped, and the temperature in the reaction furnace is lowered to a predetermined temperature, for example, 700° C. Then, in order to expel the chlorine gas in the reaction furnace, a cycle purge with the nitrogen gas is performed, and the chlorine gas is diluted to a detection limit (step S30). Thereafter, the epitaxial wafer 9 is taken out from the reaction furnace (step S31). Through the above steps, the silicon nitride passivation film 3 is formed on the nitride semiconductor layer 5.

Figure 4:
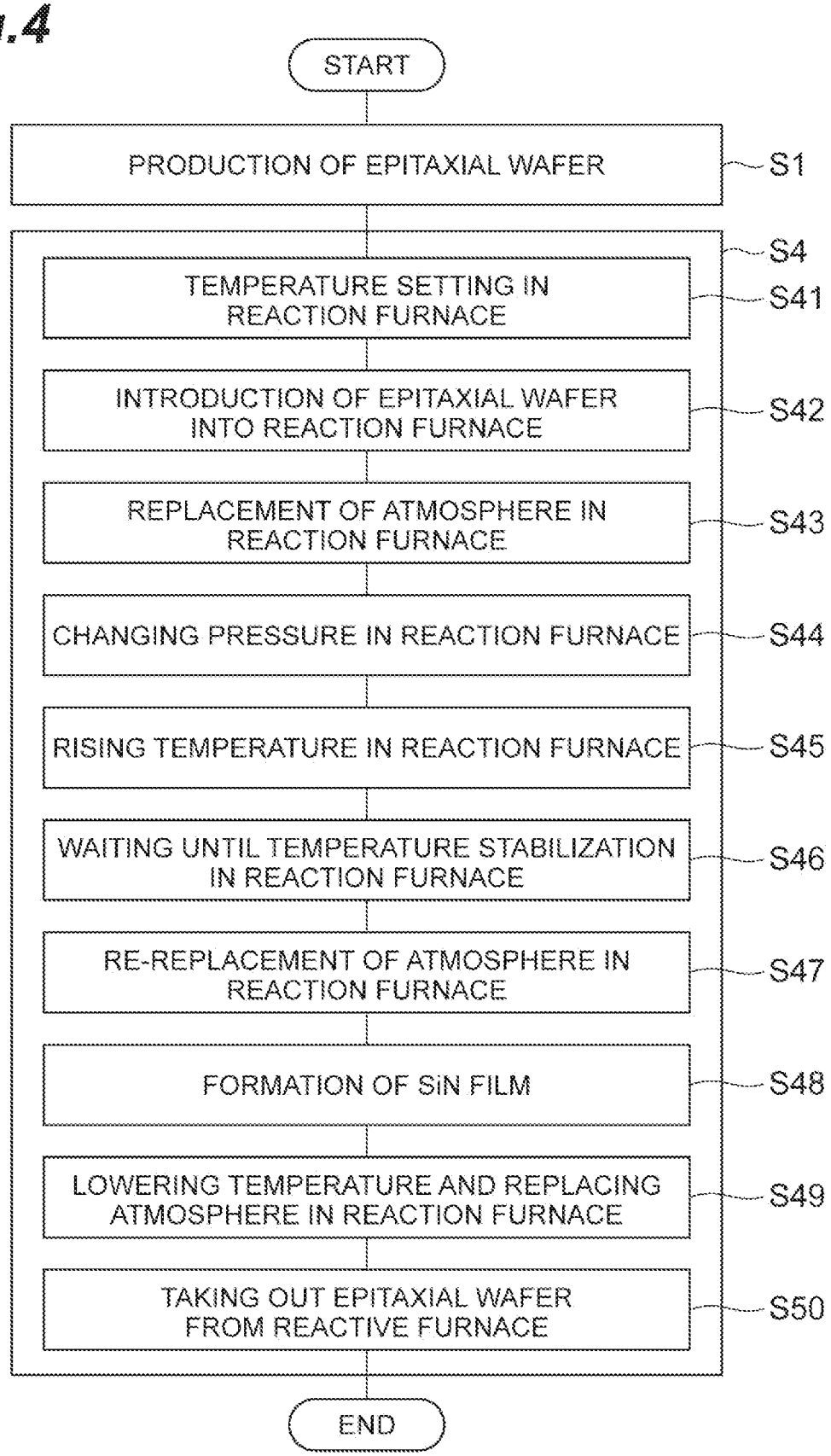
FIG. 4 is a flowchart showing a method of forming a silicon nitride passivation film according to Comparative Example 1.
Figure 5:
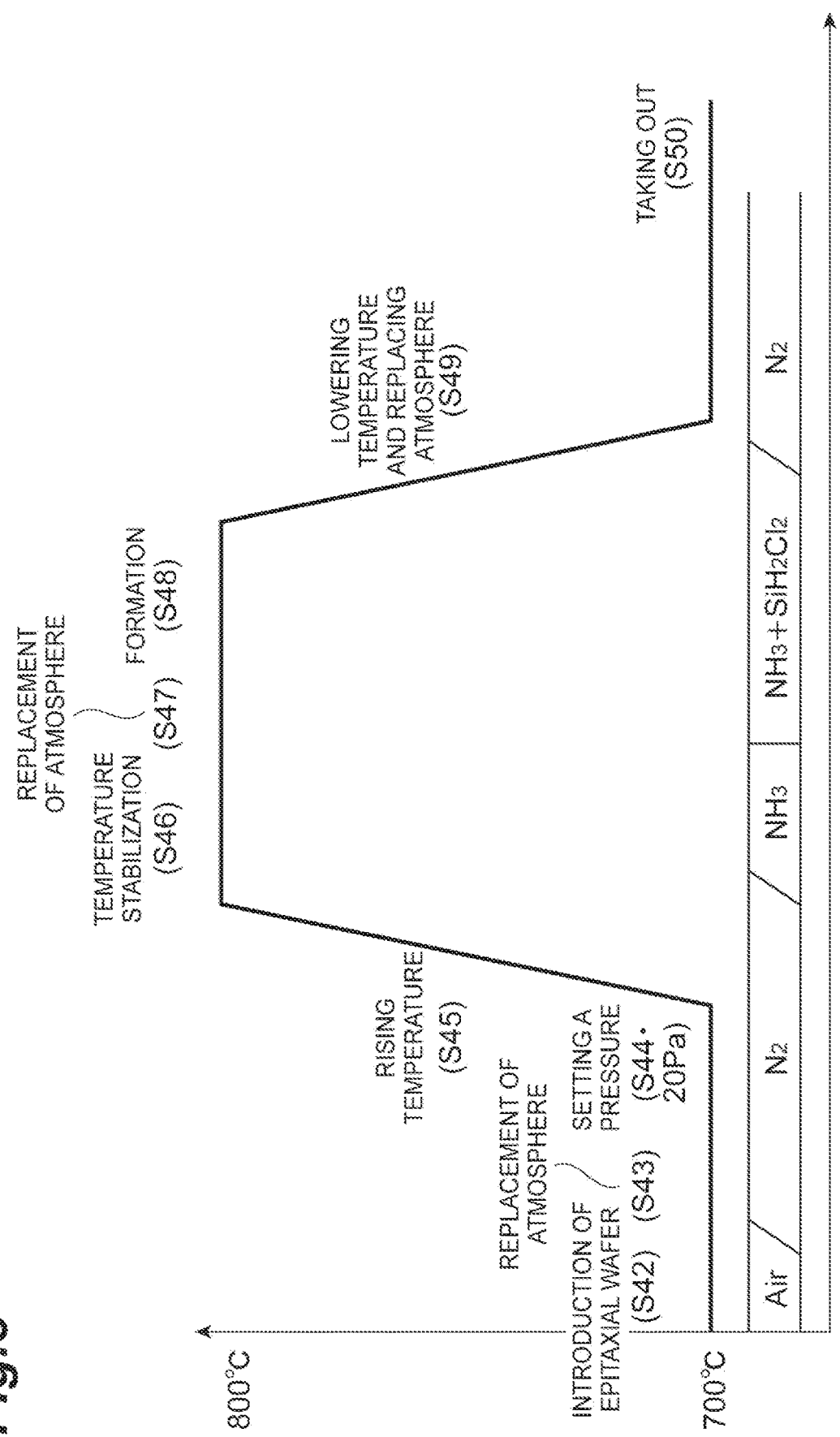
FIG. 5 is a diagram showing a control procedure of a temperature and a supply gas in a reaction furnace when a silicon nitride passivation film is formed according to Comparative Example 1.

The effect obtained by the method of forming the silicon nitride passivation film according to the present embodiment described above is described in comparison with Comparative Example 1 and Comparative Example 2. First, Comparative Example 1 is described. FIG. 4 is a flowchart showing a method of forming the silicon nitride passivation film according to Comparative Example 1. FIG. 5 is a diagram showing a control procedure of a temperature and a supply gas in the reaction furnace when the silicon nitride passivation film is formed according to Comparative Example 1. In Comparative Example 1, after step S1, by the LP CVD method, the silicon nitride passivation film 3 is formed on the nitride semiconductor layer 5 (step S4). Specifically, first, the temperature in the reaction furnace is set to 700° C. (step S41). After the temperature in the reaction furnace is stabilized at 700° C., the epitaxial wafer 9 containing the nitride semiconductor layer 5 is set in the carrier in an atmospheric atmosphere, and introduced into the reaction furnace (step S42). Next, by repeating the vacuum purge and the $N_2$ purge in the reaction furnace, the air atmosphere in the reaction furnace is replaced with a $N_2$ atmosphere (step S43).

Thereafter, in step S44, the pressure in the reaction furnace is reduced to, for example, 20 Pa, which is equivalent to the film forming pressure. Then, while maintaining the pressure in the reaction furnace, the temperature in the reaction furnace is raised to the film forming temperature (for example, 800° C.) (step S45). In step S46, the stabilization of the temperature in the reaction furnace is waited. When the temperature in the reaction furnace is stabilized, in order to change the atmosphere in the reaction furnace from the $N_2$ atmosphere to the $NH_3$ atmosphere which is the resource gas, the atmosphere is made vacuum, which is a very low pressure, and the $NH_3$ gas is purged, in step S47. At this time, the pressure in the reaction furnace is set to 20 Pa, which is a film forming pressure. The flow rate of $NH_3$ is 100 sccm. Then, when the pressures of $NH_3$ atmospheres are stabilized, dichlorosilane, which is a silicon-based source gas, is supplied into the reaction furnace to form a silicon nitride passivation film 3 in step S48. The dichlorosilane flow rate is 100 sccm.

After the forming of the silicon nitride passivation film 3 is completed, the supply of the source gas is stopped, and the temperature in the reaction furnace is lowered to a predetermined temperature, for example, 700° C. Then, in order to expel the chlorine gas in the reaction furnace, a cycle purge with the nitrogen gas is performed, and the chlorine gas is diluted to a detection limit (step S49). Thereafter, the epitaxial wafer 9 is taken out from the reaction furnace in step S50. Through the above steps, the silicon nitride passivation film 3 is formed on the nitride semiconductor layer 5.

Figure 6:
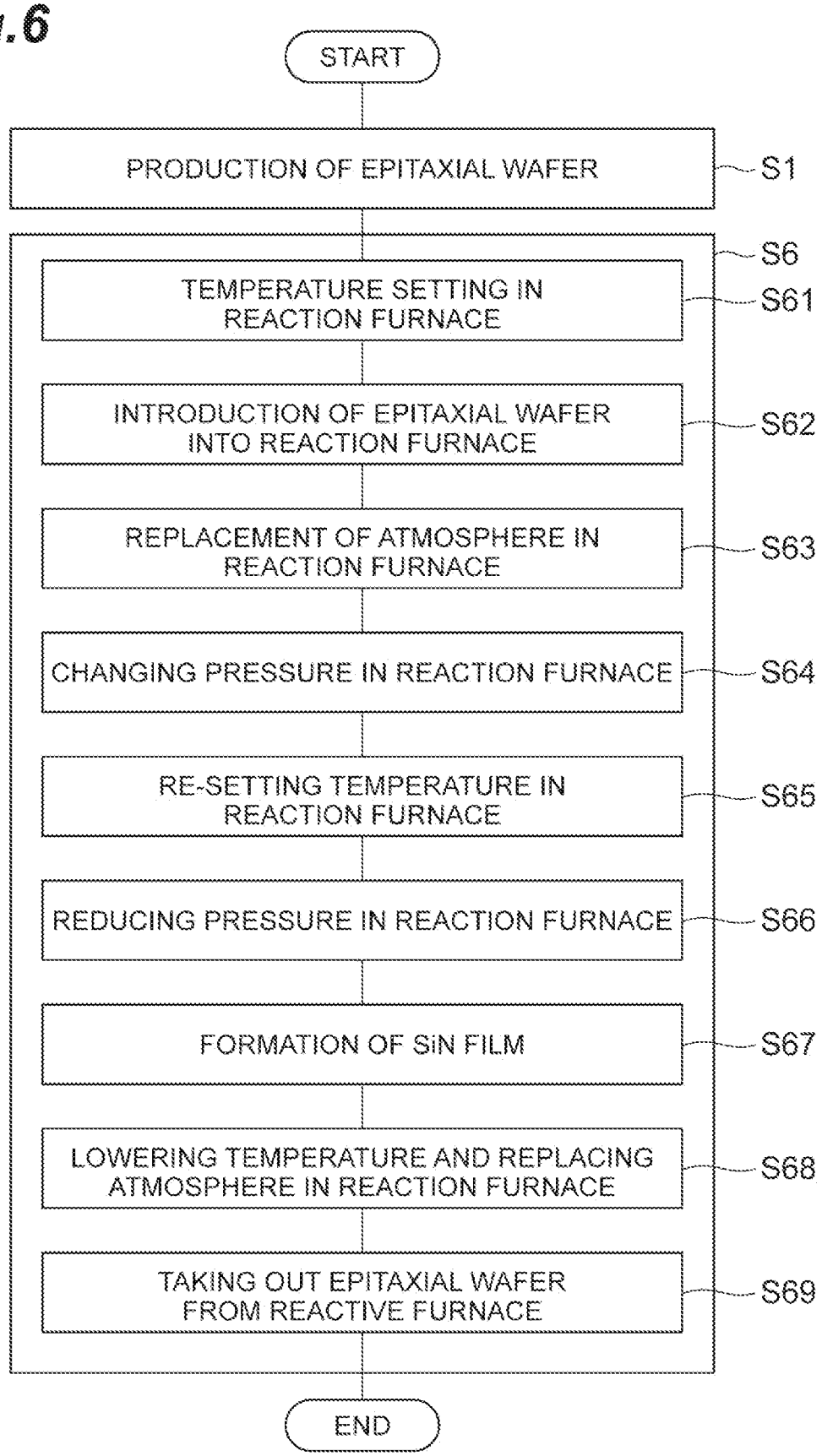
FIG. 6 is a flowchart showing a method of forming a silicon nitride passivation film according to Comparative Example 2.
Figure 7:
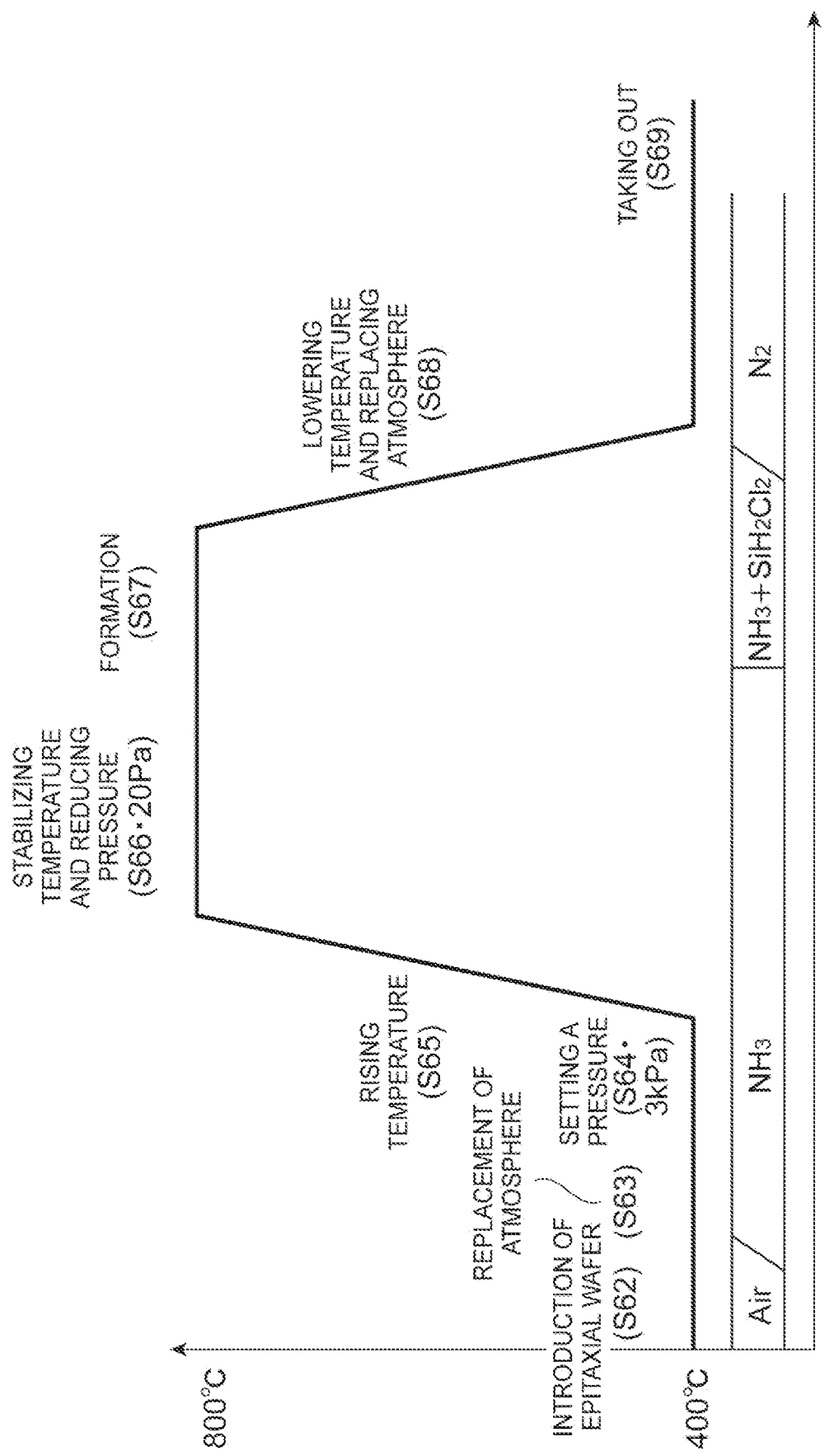
FIG. 7 is a diagram showing a control procedure of a temperature and a supply gas in a reaction furnace when a silicon nitride passivation film is formed according to Comparative Example 2.

Next, Comparative Example 2 is described. FIG. 6 is a flowchart showing a method of forming a silicon nitride passivation film according to Comparative Example 2. FIG. 7 is a diagram showing a control procedure of a temperature and a supply gas in a reaction furnace when the silicon nitride passivation film is formed according to Comparative Example 2. In Comparative Example 2, after step S1, by the LP CVD method, the silicon nitride passivation film 3 is formed on the nitride semiconductor layer 5 (step S6). Specifically, first, the temperature in the reaction furnace is set to 400° C. in step S61. After the temperature in the reaction furnace is stabilized at 400° C., the epitaxial wafer 9 containing the nitride semiconductor layer 5 is set in the carrier in an atmospheric atmosphere, and introduced into the reaction furnace (step S62). Next, by repeating the vacuum purge and the $NH_3$ purge in the reaction furnace, the atmosphere in the reaction furnace is replaced with the $NH_3$ atmosphere (step S63).

Thereafter, the pressure in the reaction furnace is changed to 3 k Pa in step S64. Then, while the pressure in the reaction furnace is maintained at the same pressure, the temperature in the reaction furnace is raised to the film forming temperature (for example, 800° C.) (step S65). Then, when the temperature in the reaction furnace is stabilized, the pressure in the reaction furnace is reduced to 20 Pa, which is the film forming pressure, in step S66. Then, dichlorosilane, which is a silicon-based source gas, is supplied into the reaction furnace to form the silicon nitride passivation film 3 in step S67. The dichlorosilane flow rate is 100 sccm.

After the forming of the silicon nitride passivation film 3 is completed, the supply of the source gas is stopped, and the temperature in the reaction furnace is lowered to a predetermined temperature, for example, 700° C. Then, in order to expel the chlorine gas in the reaction furnace, a cycle purge with the nitrogen gas is performed, and the chlorine gas is diluted to a detection limit (step S68) Thereafter, the epitaxial wafer 9 is taken out from the reaction furnace in step S69. Through the above steps, the silicon nitride passivation film 3 is formed on the nitride semiconductor layer 5.

Figure 8:
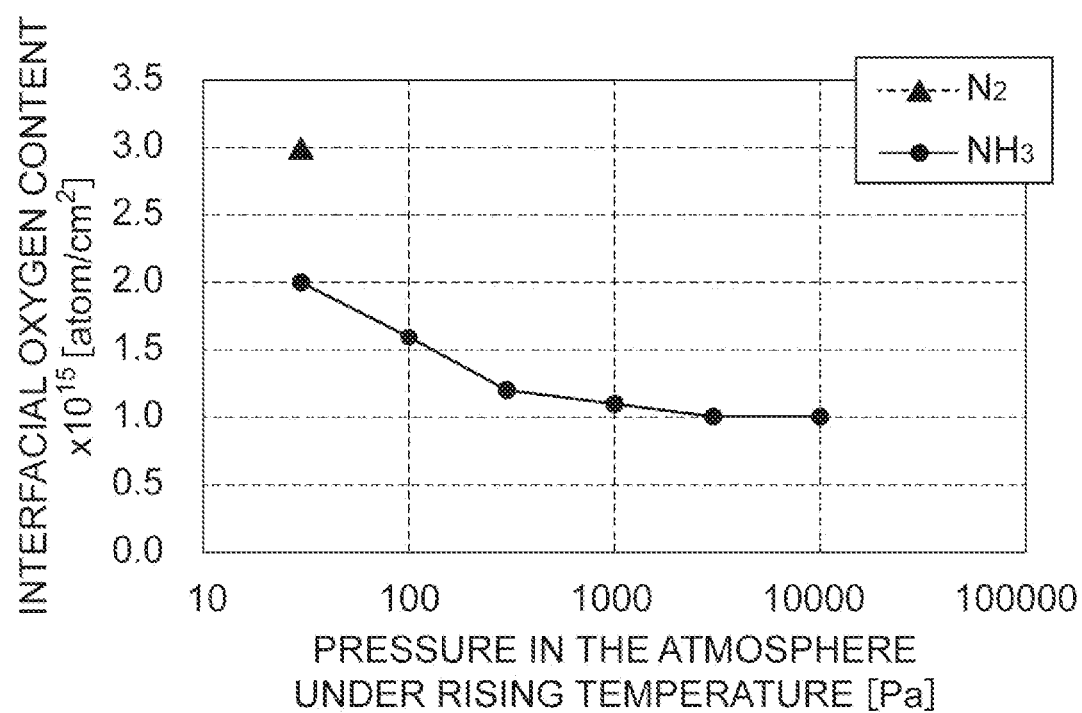
FIG. 8 is a graph showing a relationship between the temperature increasing condition and the interfacial oxygen content.

In step S25 of the present embodiment shown in FIGS. 2 and 3, unlike step S45 of Comparative Example 1 shown in FIGS. 4 and 5, the temperature is raised while the atmosphere in the reaction furnace is an atmosphere containing $NH_3$ and the pressure in the reaction furnace is the second pressure larger than the first pressure. Table 1 and FIG. 8 show the relationship between the temperature increasing condition and the interfacial oxygen content. Table 1 shows the relationship between the temperature rising conditions (here, the kind and pressure of the atmospheric gas) and the interfacial oxygen content (the amount of oxygen at the interface between the nitride semiconductor layer 5 and the silicon nitride passivation film 3). FIG. 8 is a graph plotting the results of Table 1. In the graph of FIG. 8, the horizontal axis represents the pressure as the temperature increasing condition, and the vertical axis represents the interfacial oxygen content. Incidentally, the interfacial oxygen content shown below is a numerical value obtained by investigating the epitaxial wafer 9 taken out from the reaction furnace by SIMS analysis.

TABLE 1

| KIND OF ATMOSPHERE GAS UNDER TEMPERATURE RISING CONDITION | PRESSURE UNDER TEMPERATURE RISING CONDITION [Pa] | INTERFACIAL OXYGEN CONTENT ×10$^{15}$ [atom/cm$^2$] |
|---|---|---|
| $N_2$ | 30 | 3.0 |
| $NH_3$ | 30 | 2.0 |
| $NH_3$ | 100 | 1.6 |
| $NH_3$ | 300 | 1.2 |
| $NH_3$ | 1000 | 1.1 |
| $NH_3$ | 3000 | 1.0 |
| $NH_3$ | 10000 | 1.0 |

For obtaining results of Table 1, the temperature is set to 400° C. when the epitaxial wafer 9 is introduced into the reaction furnace. Further, after the temperature inside the reaction furnace is raised under the conditions of Table 1, the inside of the reaction furnace is cleaned by maintaining the temperature inside the reaction furnace at 800° C., the atmosphere inside the reaction furnace at a $N_2$ atmosphere, and the pressure inside the reaction furnace at 30 Pa for 10 minutes. In addition, dichlorosilane is supplied into the reaction furnace at 700° C. and the silicon nitride passivation film 3 is formed at the pressure of 30 Pa in the reaction furnace.

Referring to Table 1, it can be seen that the interfacial oxygen content is reduced in the $NH_3$ atmosphere than in the $N_2$ atmosphere inside the reaction furnace. Further, it is understood that the interfacial oxygen content is particularly reduced when the pressure in the reaction furnace is 300 Pa or more, in particular, 3000 Pa or more. For obtaining the following results (Tables 2 to 4), the atmosphere in the reaction furnace is set to the $NH_3$ atmosphere and the pressure in the reaction furnace is set to 3000 Pa as a condition for raising the temperature in the reaction furnace.

In the results of Table 1 above, it is considered that the $NH_3$ atmosphere as a temperature increasing condition is used and the hydrogen ($H_2$) is generated by thermal decomposition. And it is considered that the oxygen atoms 11 contained in the oxide film on the surface of the epitaxial wafer 9 are removed by a reducing action of the hydrogen. Further, it is considered that the oxygen atom 11 contained in moisture and oxygen adhering in the reaction furnace is also removed by this reducing action. In particular, when the pressure in the reaction furnace is relatively high (e.g., when the pressure is 300 Pa or more), since the amount of the generated hydrogen is relatively large, the amount of the oxygen atoms 11 removed by the reduction action is also increased.

Figure 9:
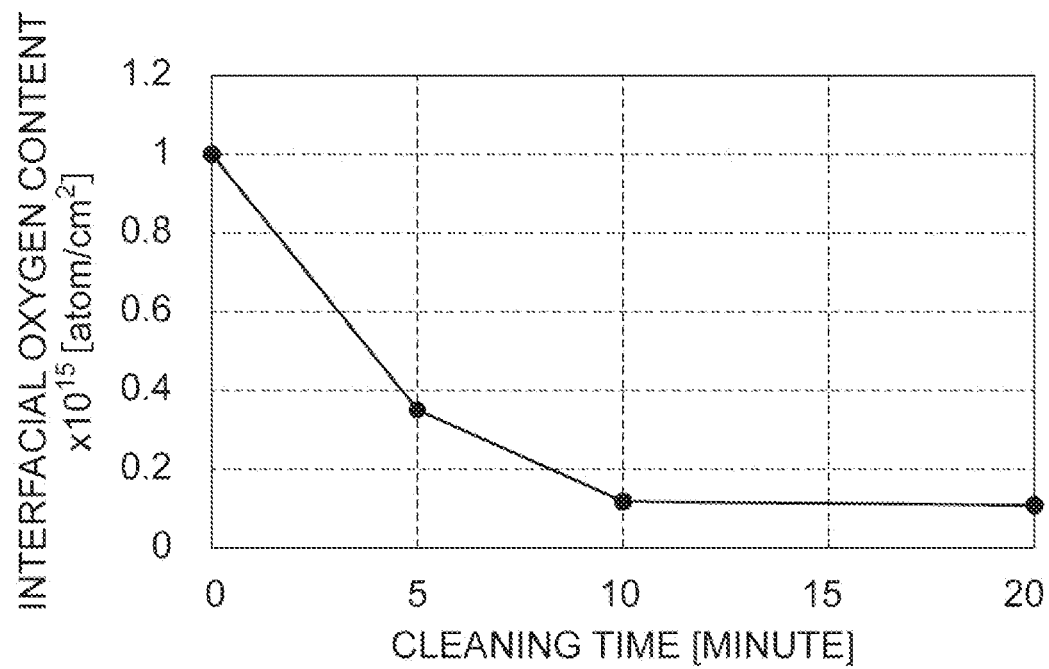
FIG. 9 is a graph showing a relationship between the cleaning time and the interfacial oxygen content.

In step S26 of the present embodiment shown in FIGS. 2 and 3, unlike Comparative Example 2 shown in FIGS. 6 and 7, the cleaning in the reaction furnace is performed. Specifically, the temperature in the reaction furnace is maintained at a first temperature higher than the film forming temperature (second temperature), the atmosphere in the reaction furnace is maintained at an atmosphere containing the $NH_3$ atmosphere, and the pressure in the reaction furnace is maintained at a second pressure higher than the pressure at the time of film forming (the first pressure) for three minutes or more. Hereinafter, the retention time (hereinafter referred to as the "cleaning time"), the type of atmospheric gas in the reaction furnace, the temperature in the reaction furnace (hereinafter referred to as the "cleaning temperature"), and the pressure in the reaction furnace (hereinafter referred to as the "cleaning pressure") are referred to as the cleaning conditions. Table 2 and FIG. 9 show the relationship between the cleaning time and the interfacial oxygen content. Table 2 shows results of the interfacial oxygen content when the cleaning time as a cleaning condition is changed. FIG. 9 is a graph plotting results of Table 2. In the graph of FIG. 9, the horizontal axis represents the cleaning time, and the vertical axis represents the interfacial oxygen content. When cleaning is not done, the time is set as 0 minute in Table 2. In addition, cleaning conditions other than the cleaning time are used in common. Specifically, the $NH_3$ atmosphere is used at 800° C., and 300 Pa.

TABLE 2

| ATMOSPHERE GAS | CLEANING TEMPERATURE [° C.] | CLEANING PRESSURE [Pa] | CLEANING TIME [MINUTE] | INTERFACIAL OXYGEN CONTENT ×10$^{15}$ [atom/cm$^2$] |
|---|---|---|---|---|
| $NH_3$ | 800 | 3000 | 0 | 1.0 |
| $NH_3$ | 800 | 3000 | 5 | 0.35 |
| $NH_3$ | 800 | 3000 | 10 | 0.12 |
| $NH_3$ | 800 | 3000 | 20 | 0.11 |

For obtaining the results of Table 2, the conditions other than the cleaning conditions are as follows. First, the temperature at which the epitaxial wafer 9 is introduced into the reaction furnace is set to 400° C. As described above, as the condition for raising the temperature in the reaction furnace, the atmosphere in the reaction furnace is set to the $NH_3$ atmosphere, and the pressure in the reaction furnace is set to 3000 Pa. The silicon nitride passivation film 3 is formed by supplying dichlorosilane into the reaction furnace. The film forming temperature is lower than that in the cleaning. And the film forming pressure is 30 Pa in the reaction furnace. When the results shown below are obtained, conditions other than the cleaning conditions are the same.

Referring to Table 2 and FIG. 9, it can be seen that the interfacial oxygen content is reduced when the cleaning in the reaction furnace is performed, compared to when cleaning in the reaction furnace is not performed, i.e., when the time in Table 2 above is 0 minutes. In addition, when the cleaning in the reaction furnace is performed for 3 minutes or more, the interfacial oxygen content is particularly reduced, and it is found that the interfacial oxygen content is further reduced in 10 minutes or more.

Figure 10:
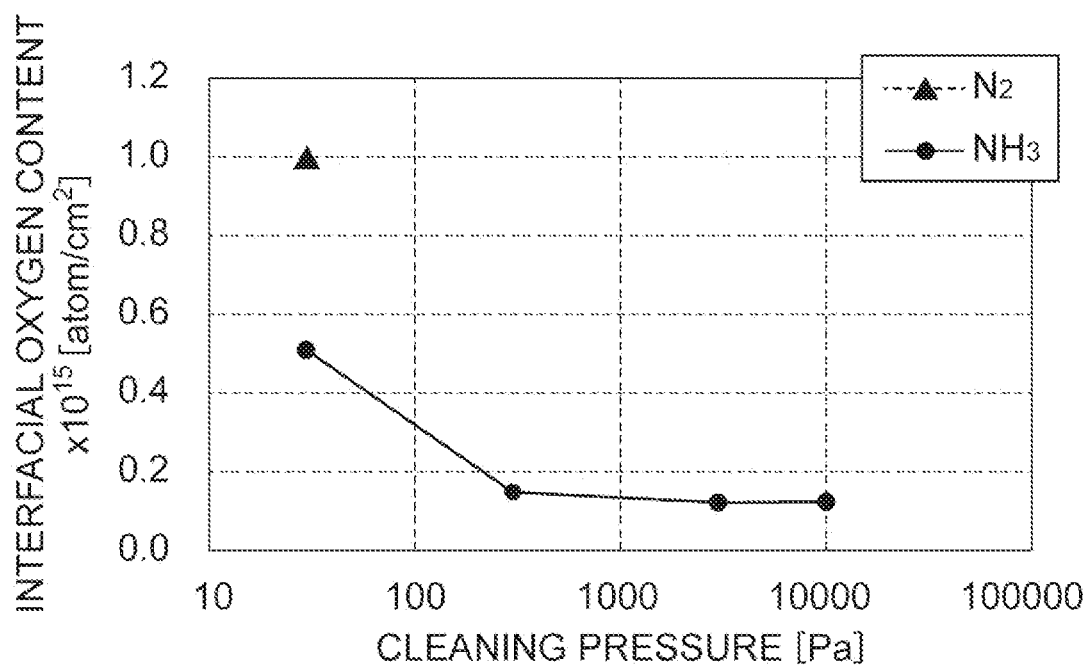
FIG. 10 is a graph showing a relationship between the cleaning pressure and the interfacial oxygen content.

Next, the results of the interfacial oxygen content are described in the case where the cleaning in the reaction furnace is performed for 10 minutes and any of the cleaning conditions other than the cleaning time is changed to form a film and the film is formed under each cleaning condition. Table 3 shows the results of the interfacial oxygen content when films are formed under various cleaning conditions by changing the type of atmospheric gas and the cleaning pressure as cleaning conditions. FIG. 10 is a graph plotting the results of Table 3, and shows the relationship between the cleaning pressure and the interfacial oxygen content. In the graph of FIG. 10, the horizontal axis represents the cleaning pressure, and the vertical axis represents the interfacial oxygen content. Here, the temperature as the cleaning condition is set to be common. Specifically, the temperature is 800° C. Referring to Tables 3 and FIG. 10, it can be seen that the interfacial oxygen content is further reduced when the atmospheric gases in the reaction furnace are $NH_3$ than when they are $N_2$. Further, it is understood that when the atmospheric gas is $NH_3$, the interfacial oxygen content is particularly reduced when the pressure is 300 Pa or more.

TABLE 3

| ATMOSPHERE GAS | CLEANING TEMPERATURE [° C.] | CLEANING PRESSURE [Pa] | CLEANING TIME [MINUTE] | INTERFACIAL OXYGEN CONTENT ×10$^{15}$ [atom/cm$^2$] |
|---|---|---|---|---|
| $N_2$ | 800 | 30 | 10 | 1.0 |
| $NH_3$ | 800 | 30 | 10 | 0.51 |
| $NH_3$ | 800 | 300 | 10 | 0.16 |
| $NH_3$ | 800 | 3000 | 10 | 0.12 |
| $NH_3$ | 800 | 10000 | 10 | 0.12 |

Figure 11:
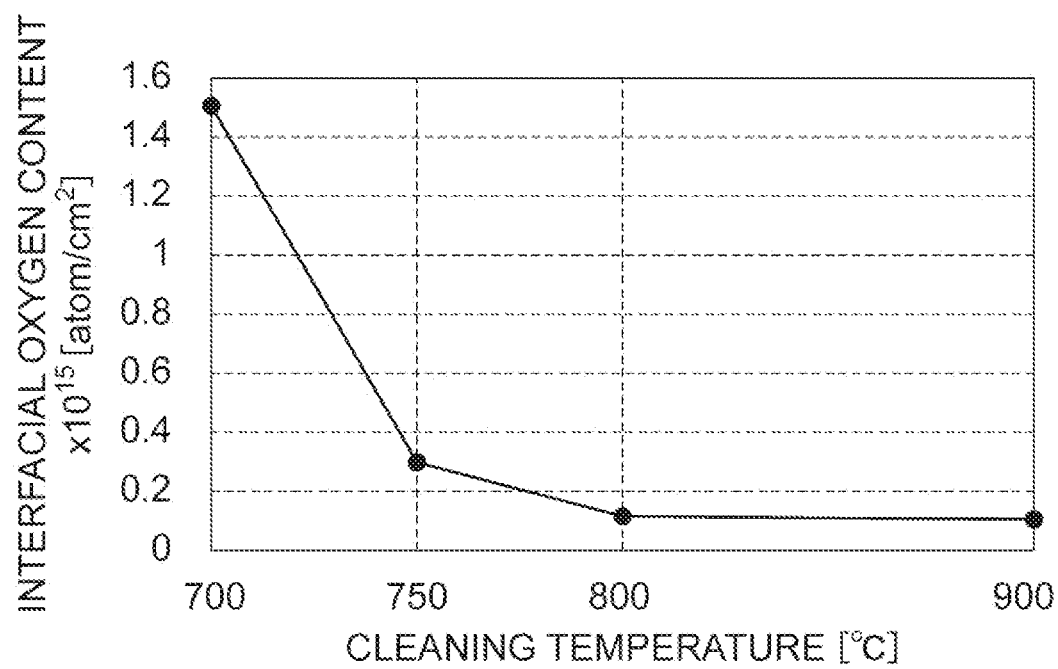
FIG. 11 is a graph showing a relationship between the cleaning temperature and the interfacial oxygen content.

Table 4 shows the results of the interfacial oxygen content in the case where the film is formed under the respective cleaning conditions by changing the temperature as the cleaning condition. FIG. 11 is a graph plotting the results of Table 4, and shows the relationship between the cleaning temperature and the interfacial oxygen content. In the graph of FIG. 11, the horizontal axis represents the cleaning temperature, and the vertical axis represents the interfacial oxygen content. Here, the cleaning conditions other than the temperature are used in common. Specifically, at the $NH_3$ atmosphere and the pressure is 3000 Pa. Referring to Table 4, it can be seen that the interfacial oxygen content is particularly reduced when the temperature is 750° C. or higher.

TABLE 4

| ATMOSPHERE GAS | CLEANING TEMPERATURE [° C.] | CLEANING PRESSURE [Pa] | CLEANING TIME [MINUTE] | INTERFACIAL OXYGEN CONTENT ×10$^{15}$ [atom/cm$^2$] |
|---|---|---|---|---|
| $NH_3$ | 700 | 3000 | 10 | 1.5 |
| $NH_3$ | 750 | 3000 | 10 | 0.25 |
| $NH_3$ | 800 | 3000 | 10 | 0.12 |
| $NH_3$ | 900 | 3000 | 10 | 0.11 |

From the above results, it is found that the interfacial oxygen content is particularly reduced when the inside of the reaction furnace is cleaned by maintaining the temperature in the reaction furnace at 750° C. or more, the atmosphere in the reaction furnace at the $NH_3$ atmosphere, and the pressure in the reaction furnace at 300 Pa or more for 3 minutes.

As in the present embodiment, the following effects (1) and (2) can be expected by exposing the epitaxial wafer 9 for 3 minutes or more in the atmosphere higher than the film forming temperature and the atmosphere containing $NH_3$ prior to the film forming.

(1) The oxygen atoms 11 contained in the oxide film on the surface of the nitride semiconductor layer 5 are removed by reduction.

(2) The oxygen atoms 11 contained in moisture and oxygen, which are responsible for the desorption gas adhering in the reaction furnace, are also reduced, and the forming of a new oxide film in the reaction furnace is suppressed.

Since the synergistic effect of the above (1) and (2), the interfacial oxygen content is sufficiently reduced and the gate leakage current is reduced. Therefore, it is possible to improve the electrical characteristics of the semiconductor device. In particular, when the interfacial oxygen content is 0.6×10$^{15}$ atom/cm$^2$ or less, i.e., when the interfacial oxygen content is 0.6×10$^{15}$ atom/cm$^2$ or less at the atmospheric pressure, the gate leakage current is significantly reduced and the electric characteristics of the semiconductor device are prevented from deteriorating.

Incidentally, when the surface of the epitaxial wafer is exposed to the atmosphere, for example, carbon, fluorine or the like (hereinafter, referred to simply as "carbon or the like") may be taken into the epitaxial wafer in addition to the above-mentioned oxygen or the like. These carbons behave as impurities that form deep acceptor levels in a nitride semiconductor. Therefore, when carbon or the like is incorporated into the nitride semiconductor, for example, an increase in leakage current of the semiconductor device, directly linked to problems such as deterioration of the collapse characteristics.

Here, according to the inventors, fluorine is hardly considered to be present in a large amount in the reaction furnace as compared with carbon and oxygen. However, after epitaxial growth, subjected to cleaning treatment using IPA (isopropyl alcohol) prior to film forming, the nitride semiconductor layer 5 formed by the LP CVD method (e.g., GaN layer) includes a fluorine on the surface which is detected in the amounts of $1\times10^{11}$ atom/cm$^2$ or less. Note that this value is a value as small as 4 orders of magnitude as compared with the amount of oxygen atoms 11. Since the treatment performed in the reaction furnace includes, for example, a treatment in which a hydrofluoric acid (HF) based solution such as RCA cleaning is used, it is considered that fluorine is present in the atmosphere, albeit somewhat, and adheres to the surface of the epitaxial wafer 9. When working in a reaction furnace, it is difficult to avoid the adhesion of fluorine to the surface of the epitaxial wafer 9.

On the other hand, carbon and fluorine on the surface of the epitaxial wafer 9 are also removed by the synergistic effect of (1) and (2). This is because $H_2$ is generated by the atmosphere including $NH_3$. Specifically, the residual fluorine (F) reacts with hydrogen atoms (H) in the atmosphere gas to form hydrofluoric acid (HF) and is vaporized. The carbon (C) reacts with hydrogen atoms (H) in the atmospheric gas to form methane (CH 4) and is vaporized. Thus, by removing carbon and fluorine at the interface between the nitride semiconductor layer 5 and the silicon nitride passivation film 3, problems caused by residual impurities on the surface of the epitaxial wafer 9 as described above is reduced. Thus, the gate leakage current is reduced, it is possible to improve the electrical characteristics of the semiconductor device.

Second Embodiment

Next, as a second embodiment, including the method of forming the silicon nitride passivation film 3 according to the first embodiment, a method of manufacturing a semiconductor device comprising a nitride semiconductor as a main constituent material is described. FIGS. 12A to 14C are diagrams showing steps of the manufacturing method according to the present embodiment. This embodiment exemplifies a GaN-HEMT as a semiconductor device.

Figure 12A:
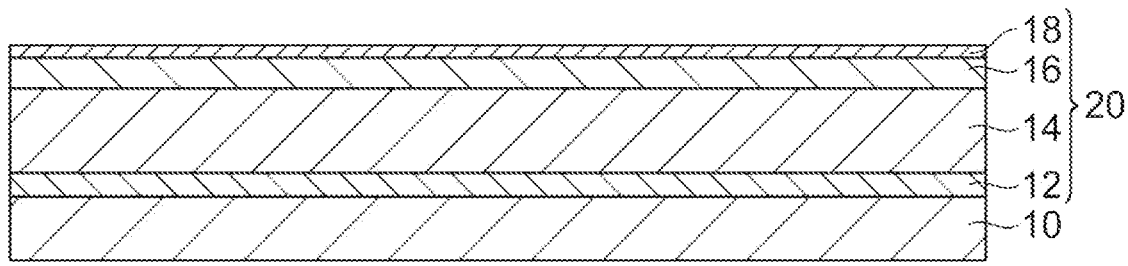
FIG. 12A is a diagram showing each step of a manufacturing method according to a second embodiment.

First, as shown in FIG. 12A, on the substrate 10, by the MOCVD method, a stacking structure 20 including a plurality of nitride semiconductor layers (semiconductor stacking structure, the semiconductor stacking portion) is formed. Substrate 10 is, for example, a SiC substrate having a (0001) main surface, the stacking direction of the stacking structure 20 is, for example, [0001] direction. The stacking structure 20 includes a nucleation layer 12, an electron traveling layer 14, an electron supply layer 16, and a cap layer 18, which are sequentially formed from the substrate 10 side. The nucleation layer 12 is, for example, an AlN layer having a thickness of several tens of nm. The electron traveling layer 14 is, for example, an undoped GaN layer having a thickness of 1000 nm. The electron supply layer 16 is, for example, an n-type AlGaN layer having a thickness of 20 nm. The cap layer 18 is, for example, an n-type GaN layer having a thickness of 5 nm.

At this time, an oxygen film is formed on the surface of the cap layer 18 by atmospheric exposure. When this oxygen film is examined by SIMS analysis, oxygen atoms are present at an interfacial oxygen content of about $0.6\times10^{15}$ atom/cm$^2$.

Figure 12B:
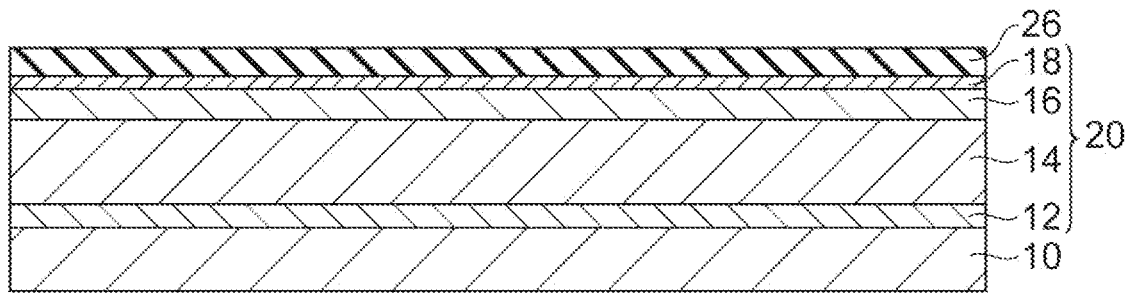
FIG. 12B is a diagram showing each step of the manufacturing method according to the second embodiment.

Next, as shown in FIG. 12B, the silicon nitride passivation film (SiN film) 26 on the upper surface of the stacking structure 20 is formed by the LP CVD method. At this time, a film forming method of the silicon nitride passivation film 3 according to the first embodiment is applied. The film forming temperature is, for example, 800° C. and the film is formed by using $NH_3$ gas and dichlorosilane ($SiH_2Cl_2$) gas as source gases. At this time, when the oxide film existing at the interface between the SiN film 26 and the stacking structure 20 is analyzed by ToF-SIMS (Time-of-Flight Secondary Ion Mass Spectrometry) analysis, oxygen atoms exist as silicon oxynitride.

Figure 15:
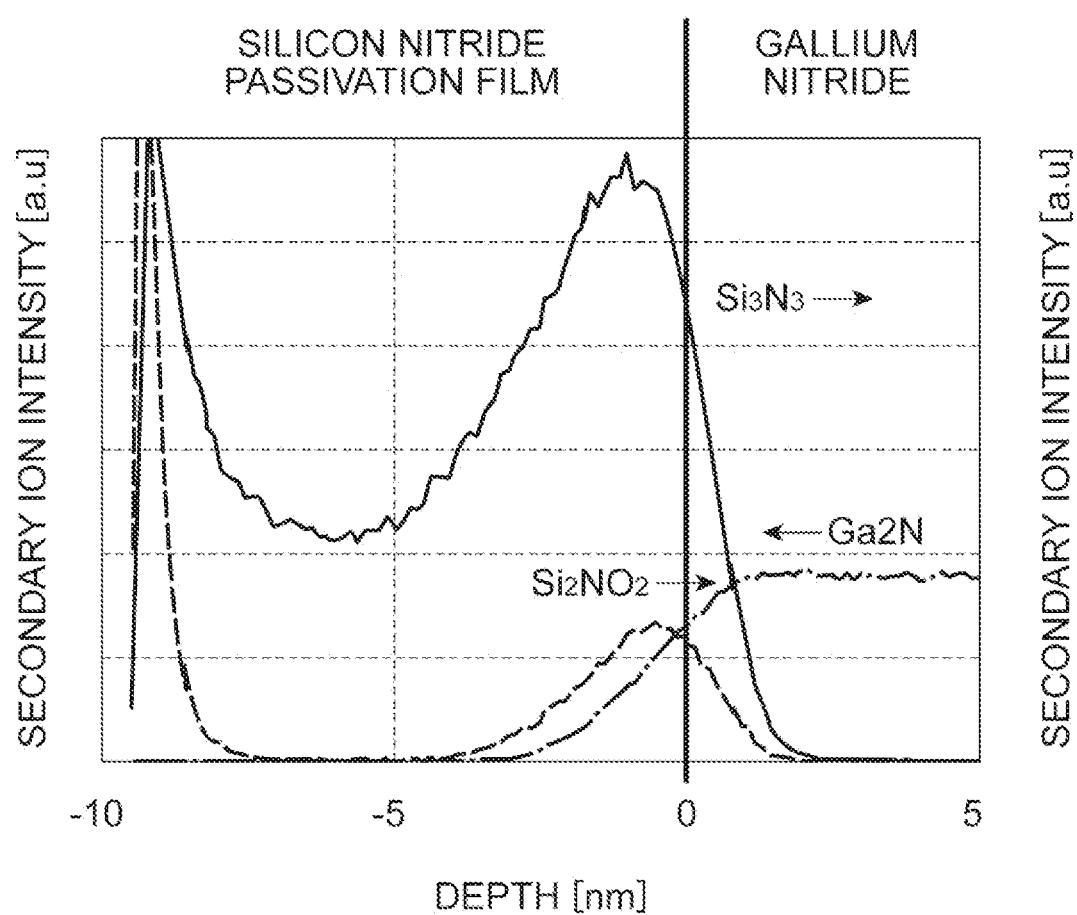
FIG. 15 is a graph showing results of ToF-SIMS analysis of the silicon nitride passivation film after the silicon nitride passivation film is formed.

Specifically, nitride semiconductors after epitaxial growth have the surface oxidized by the influence of atmospheric exposure. However, after the film forming of the SiN film 26, the oxygen of the oxide nitride semiconductor moves to the silicon nitride side and becomes the silicon oxynitride. FIG. 15 is a graph showing results of ToF-SIMS analysis after forming the silicon nitride passivation film. In the graph of FIG. 15, the horizontal axis is the depth and the vertical axis is the secondary ion intensity. However, the left vertical axes are one order of magnitude larger than the right vertical axis. FIG. 15 shows that after forming the silicon nitride passivation film, it can be seen that the gallium oxide on the gallium nitride becomes the silicon oxynitride.

Note that ToF-SIMS analysis is an analysis method for mass-analyzing secondary ions emitted by irradiating a pulsed beam as a primary ion beam. In ToF-SIMS analysis, information of elements and molecular existing on the outermost surface of the sample can be detected with a small ion beam dose ($1\times10^{12}$ cm$^{-2}$ or less). Examples of the primary ion beam used in ToF-SIMS analysis include an ion beam having a relatively heavy mass (Bi, Au, etc.) and a Ga ion beam or the like which can be easily made into a fine beam.

Figure 12C:
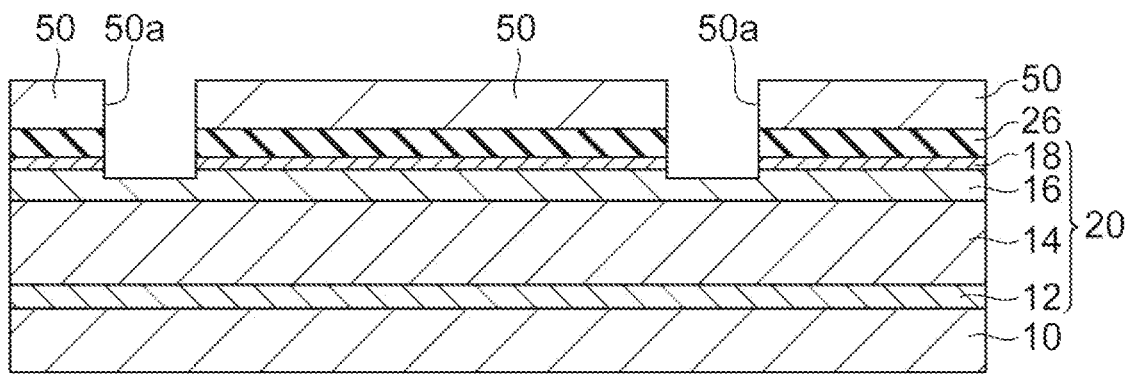
FIG. 12C is a diagram showing each step of the manufacturing method according to the second embodiment.

Next, as shown in FIG. 12C, a photoresist 50 is applied onto the SiN film 26. By photolithography, an opening 50a is formed in the photoresist 50. Openings are formed in the SiN film 26 and the cap layer 18 by reactive ion etching (RIE) using the photoresist 50 as a mask. Thereafter, the photoresist 50 is removed.

Figure 13A:
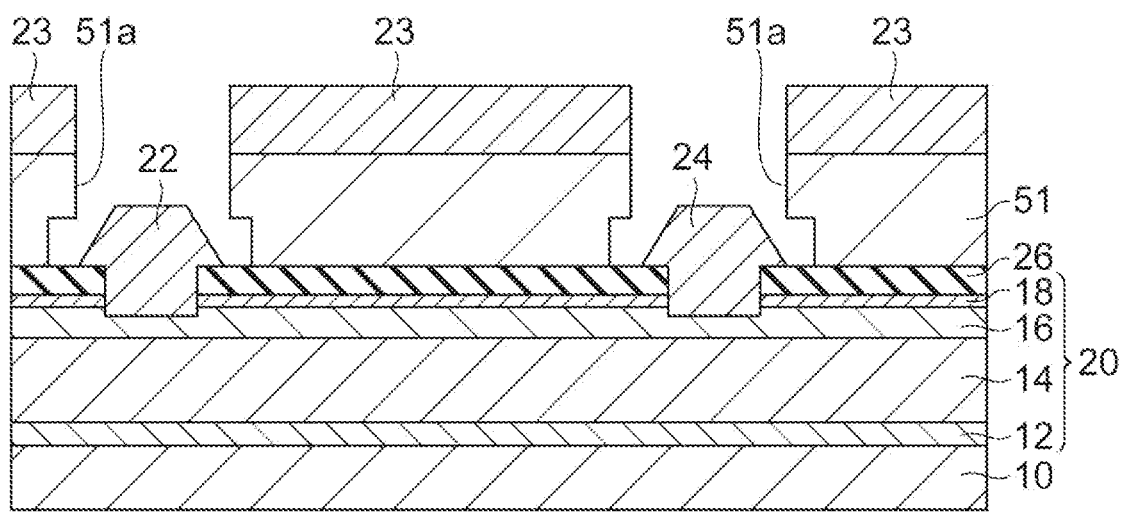
FIG. 13A is a diagram showing each step of the manufacturing method according to the second embodiment.

Next, as shown in FIG. 13A, another photoresist 51 is applied on the SiN film 26. By photolithography, an opening 51a of the photoresist 51 is formed on the opening of the SiN film 26. The source electrode 22 and the drain electrode 24 on the electron supply layer 16 through the opening of the SiN film 26 is formed using a vapor deposition method. The source electrode 22 and the drain electrode 24 both have a Ti film and an Al film. The thickness of the Ti film is, for example, 30 nm, and the thickness of the Al film is, for example, 300 nm. The Ti film may be a Ta film. Metal 23 is deposited on the photoresist 51. Thereafter, the metal 23 on the photoresist 51 is removed by removing the photoresist 51. Thus, the source electrode 22 and the drain electrode 24 in contact with the electron supply layer 16 is formed. For example, by heat treatment at 400° C., the source electrode 22 and the drain electrode 24 are alloyed with the electron supply layer 16. If 550° C. or higher, it further contributes to low resistance of the contact resistance.

Figure 13B:
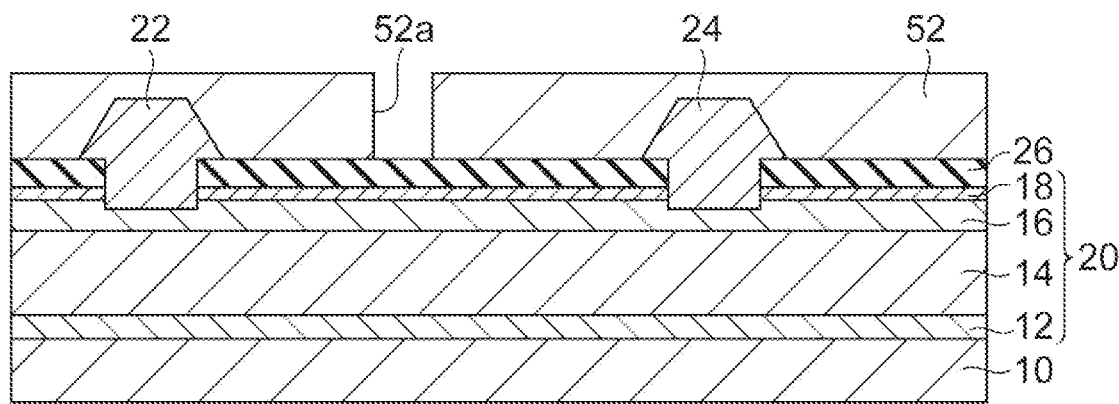
FIG. 13B is a diagram showing each step of the manufacturing method according to the second embodiment.

Subsequently, as shown in FIG. 13B, another photoresist 52 is applied on the multilayer structure 20. By photolithography, an opening 52a is formed in the photoresist 52. An opening is formed in the SiN film 26 by RIE using the photoresist 52 as a mask. Thereafter, the photoresist 52 is removed.

Figure 14A:
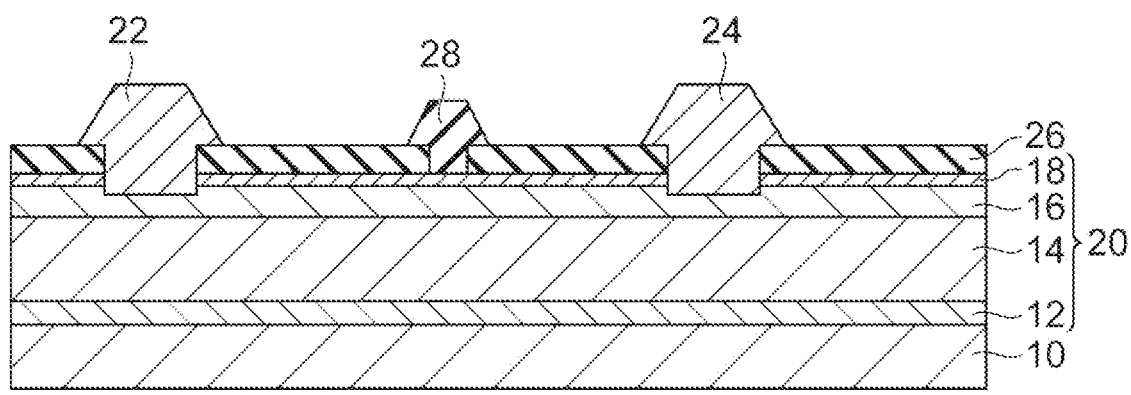
FIG. 14A is a diagrams showing each step of the manufacturing method according to the second embodiment.

Subsequently, a photoresist is applied onto the stacking structure 20. An opening serving as a gate electrode pattern is formed in the photoresist by photolithography. By the deposition method, as shown in FIG. 14A, a gate electrode 28 is formed on the cap layer 18. The gate electrode 28 has a Ni film and Au film from the stacking structure 20 side. The thickness of the Ni film is, for example, 50 nm, and the thickness of the Au film is, for example, 400 nm. As an evaporation method, various methods such as an EB evaporation method, a sputter evaporation method, and a resistance heating evaporation method are used. The metal deposited on the photoresist is removed along with the photoresist.

Figure 14B:
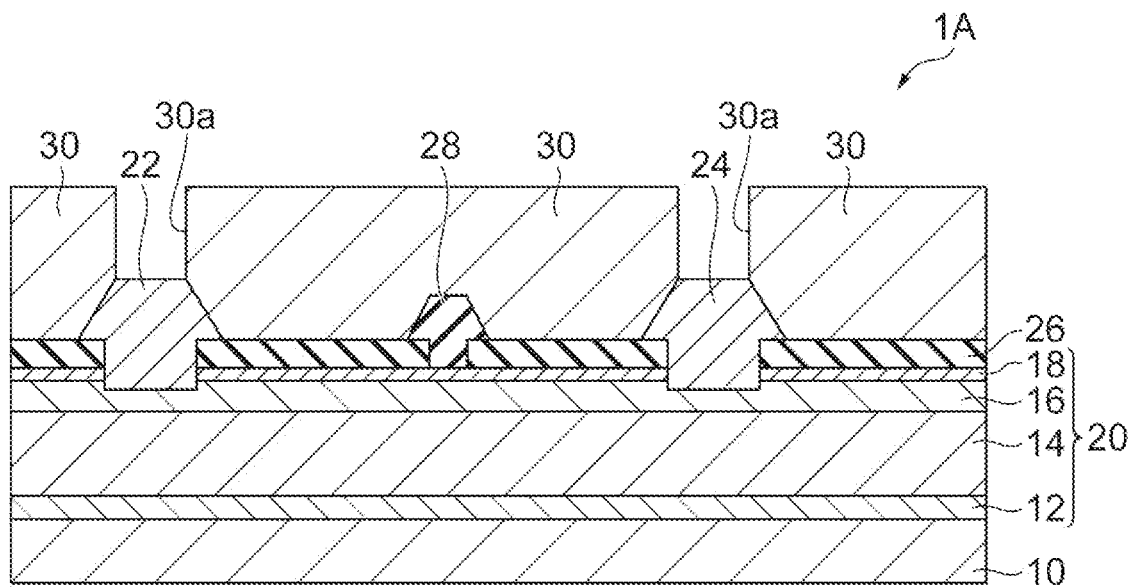
FIG. 14B is a diagram showing each step of the manufacturing method according to the second embodiment.

Subsequently, as shown in FIG. 14B, an insulating film 30 is formed on the SiN film 26 by, for example, a PE CVD (Plasma Enhanced Chemical Vapor Deposition) method and covers the gate electrode 28. The insulating film 30 is, for example, a SiN film having a thickness of 500 nm. An opening 30a is formed in the insulating film 30 by etching with buffered hydrofluoric acid to expose the source electrode 22 and the drain electrode 24. Through the above steps, a HEMT 1A is produced.

As shown in FIG. 14B, the fabricated HEMT 1A comprises a substrate 10, a stacking structure 20 provided on the substrate 10 including a plurality of nitride semiconductor layers. The stacking structure 20 includes a nucleation layer 12, an electron traveling layer 14, an electron supply layer 16, and a cap layer 18 formed in this order from the substrate 10 side. The nucleation layer 12, the electron traveling layer 14, the electron supply layer 16, and the cap layer 18 are each composed of a nitride semiconductor. HEMT 1A further comprises a SiN film 26. The SiN film 26 covers the surface of the stacking structure 20. Specifically, the SiN film 26 covers the surface of the cap layer 18. In the manufactured HEMT 1A, the interface between the SiN film 26 and the cap layer 18 contains oxygen atoms in an interfacial oxygen content of $0.6\times10^{15}$ atom/cm$^2$ or less as silicon oxynitride. The SiN film 26 has a plurality of openings. In these openings, the stacking structure 20 from the SiN film 26 (electron supply layer 16 or cap layer 18) is exposed.

HEMT 1A further comprises a source electrode 22, a drain electrode 24, a gate electrode 28, and an insulating film 30. The source electrode 22 and the drain electrode 24 are arranged in order along the plane of the substrate 10. The source electrode 22, the drain electrode 24, and the gate electrode 28 cover the opening of the SiN film 26, respectively. Further, the gate electrode 28 is provided between the source electrode 22 and the drain electrode 24 on the stacking structure 20. The insulating film 30 is a protective film covering the gate electrode 28.

According to the manufacturing method of the semiconductor device described above, by forming the SiN film 26 with the LP CVD method like the method described in the first embodiment, it is possible to reduce the amount of oxygen at the interface between the nitride semiconductor layer (cap layer 18) and the SiN film 26.

Further, HEMT 1A includes the substrate 10 and the stacking structure 20 provided on the substrate 10, which contains a plurality of nitride semiconductor layers each composed of a nitride semiconductor (nucleation layer 12, the electron traveling layer 14, the electron supply layer 16, and the cap layer 18). Also, HEMT 1A includes the SiN film 26 covering the surface of the stacking structure 20, and oxygen atoms which present at the interface oxygen content of $0.6\times10^{15}$ atom/cm$^2$ or less at the interface between the SiN film 26 and the laminated structure 20. According to this HEMT 1A, since the interfacial oxygen content is reduced to $0.6\times10^{15}$ atom/cm' or less, the gate leakage current is significantly reduced, and the electric characteristics of the semiconductor device are suppressed from deteriorating.

Third Embodiment

Figure 16:
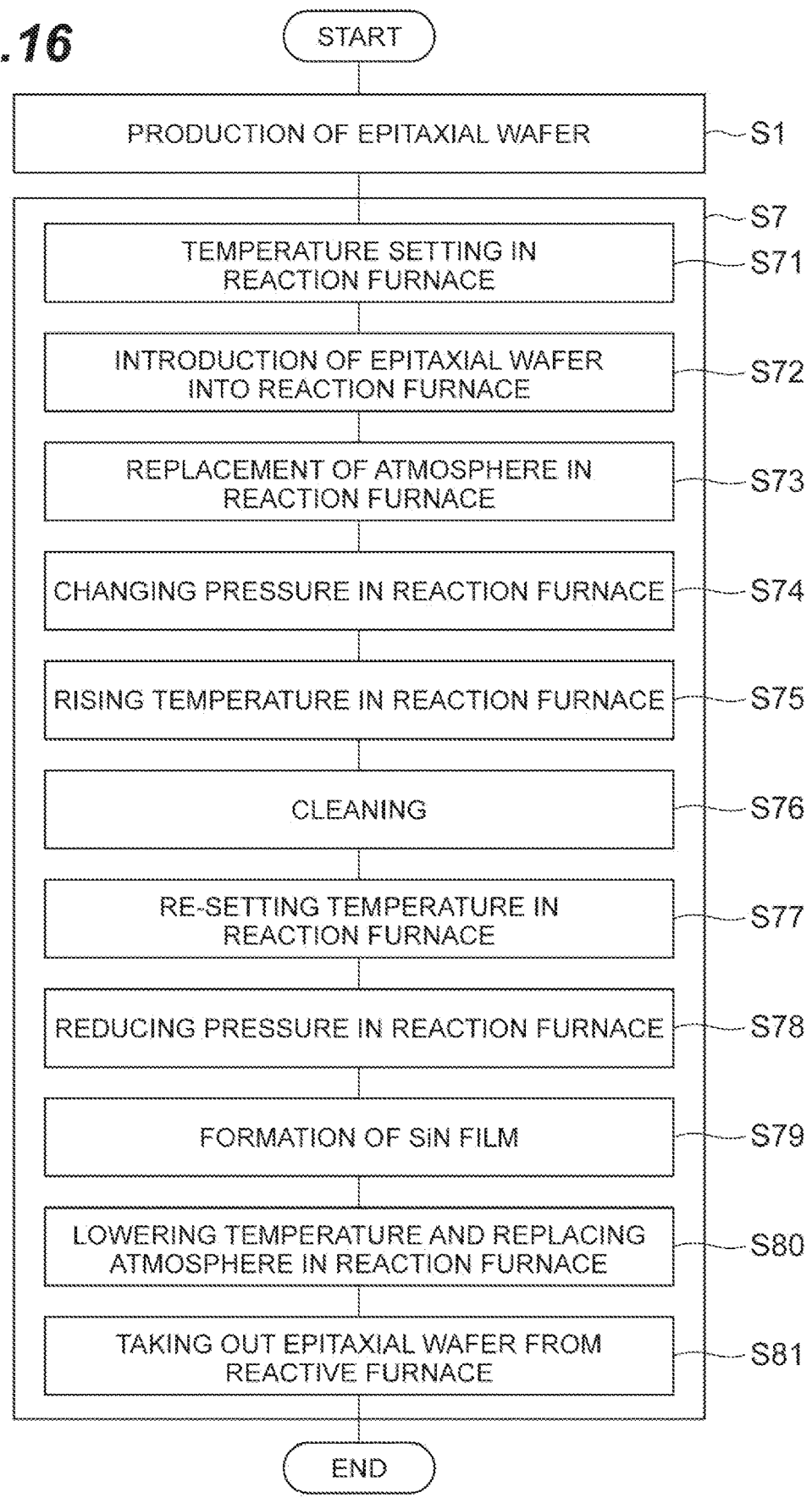
FIG. 16 is a flowchart showing a method of forming a silicon nitride passivation film according to a third embodiment.

Next, a method of forming the silicon nitride passivation film 3 shown in FIG. 1 by the film forming method according to the third embodiment is described. FIG. 16 is a flowchart showing a method of forming the silicon nitride passivation film 3 according to the third embodiment. The film forming method according to the third embodiment differs from the film forming method according to the first embodiment in step S7 which is performed instead of step S2 and is otherwise the same as the film forming method according to the first embodiment. That is, in the third embodiment, after step S1, by performing step S7, the silicon nitride passivation film 3 is formed on the nitride semiconductor layer 5.

In step S7, first, steps S71 to S77 are performed in order. Steps S71 to S77 are the same as steps S21 to S27 in step S2, respectively. After the temperature in the reaction furnace is stabilized to the second temperature in step S77, the pressure in the reaction furnace is gradually changed to be reduced to the first pressure of 30 Pa or less in step S78. In step S78, the pressure in the reaction furnace is reduced without making vacuum as in the S47 of Comparative Example 1. Specifically, it performs a control of the input gas flow rate and the exhaust valve into the reaction furnace by APC (Auto Pressure Controller). As a result, the pressure in the reaction furnace is adjusted to the first pressure, which is the pressure at the time of film forming, while maintaining the desired gas atmosphere without making the pressure extremely low. In one embodiment, the first pressure is 20 Pa.

Then, steps S79 to S81 are performed in order. Steps S79 to S81 are the same as steps S29 to S31 in step S2, respectively. Through the above steps, the silicon nitride passivation film 3 is formed on the nitride semiconductor layer 5.

According to the method of forming the silicon nitride passivation film 3 according to the third embodiment described above, the same effect as the method of forming the silicon nitride passivation film 3 according to the first embodiment can be obtained. Specifically, when the silicon nitride passivation film on the nitride semiconductor is formed by the LP CVD method, it is possible to reduce the amount of oxygen at the interface between the nitride semiconductor and the silicon nitride passivation film due to step S76.

Figure 17:
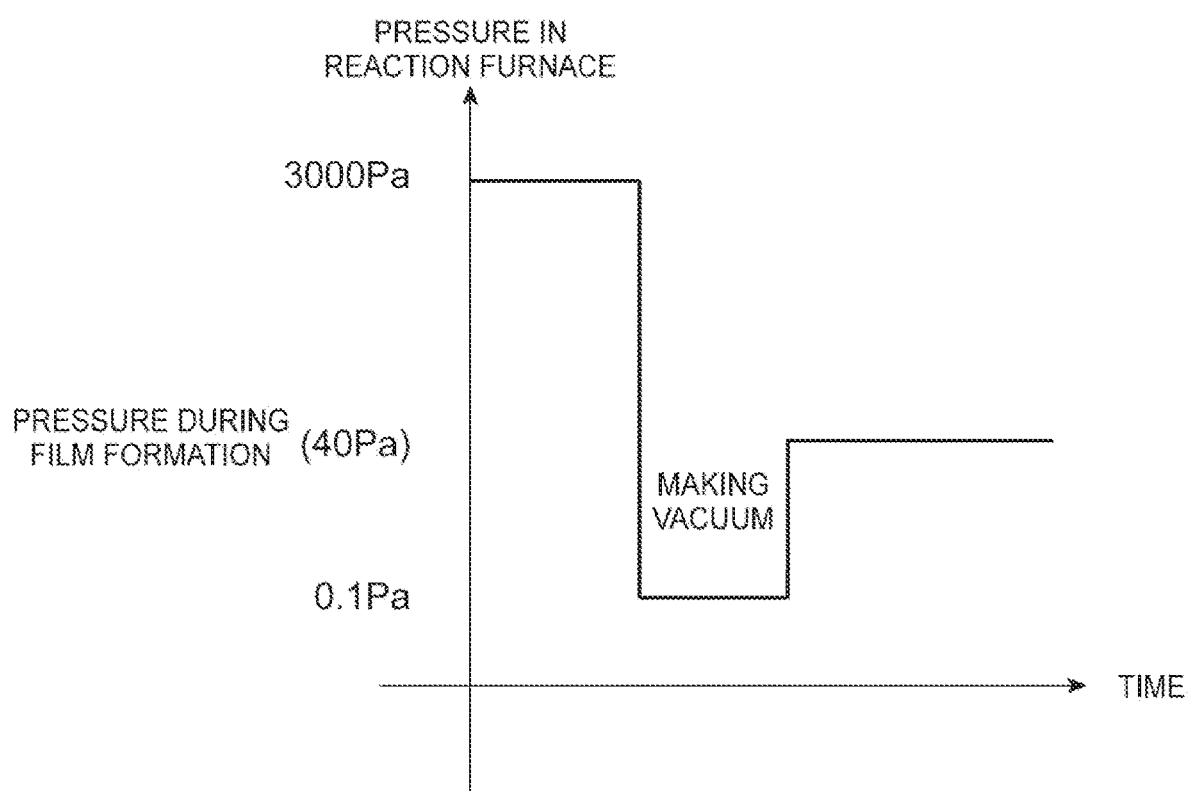
FIG. 17 is a graph showing pressure changes in the reaction furnace when a silicon nitride passivation film is formed according to Comparative Example 1.

Next, a further effect obtained by the method of forming the silicon nitride passivation film 3 according to the third embodiment is described in comparison with Comparative Example 1. FIG. 17 is a graph showing pressure changes in the reaction furnace when a silicon nitride passivation film is formed according to Comparative Example 1. In the graph of FIG. 17, the horizontal axis is time, the vertical axis is the pressure. In Comparative Example 1, a change from a high pressure to a low pressure is accompanied in a high temperature atmosphere during the replacement of the atmosphere in the reaction furnace before the film forming (step S47). Therefore, from the viewpoint of suppressing nitrogen atom missing from the nitride semiconductor surface, it seems important to minimize the time maintaining a high-temperature atmosphere under a low pressure. As shown in FIG. 17, to minimize the time maintaining a high-temperature atmosphere, at first, the reaction furnace is made vacuum and a source gas is introduced. And it is subjected to pressure adjustment. However, the LP CVD equipment uses a quartz member in the reaction furnace, and because the equipment is large in size, a degassing (a phenomenon in which residues adhering to the inner wall of the reaction furnace are released into the reaction furnace again) occurs as a result of making vacuum, and there is a concern that the interfacial oxygen content may increase.

Figure 18:
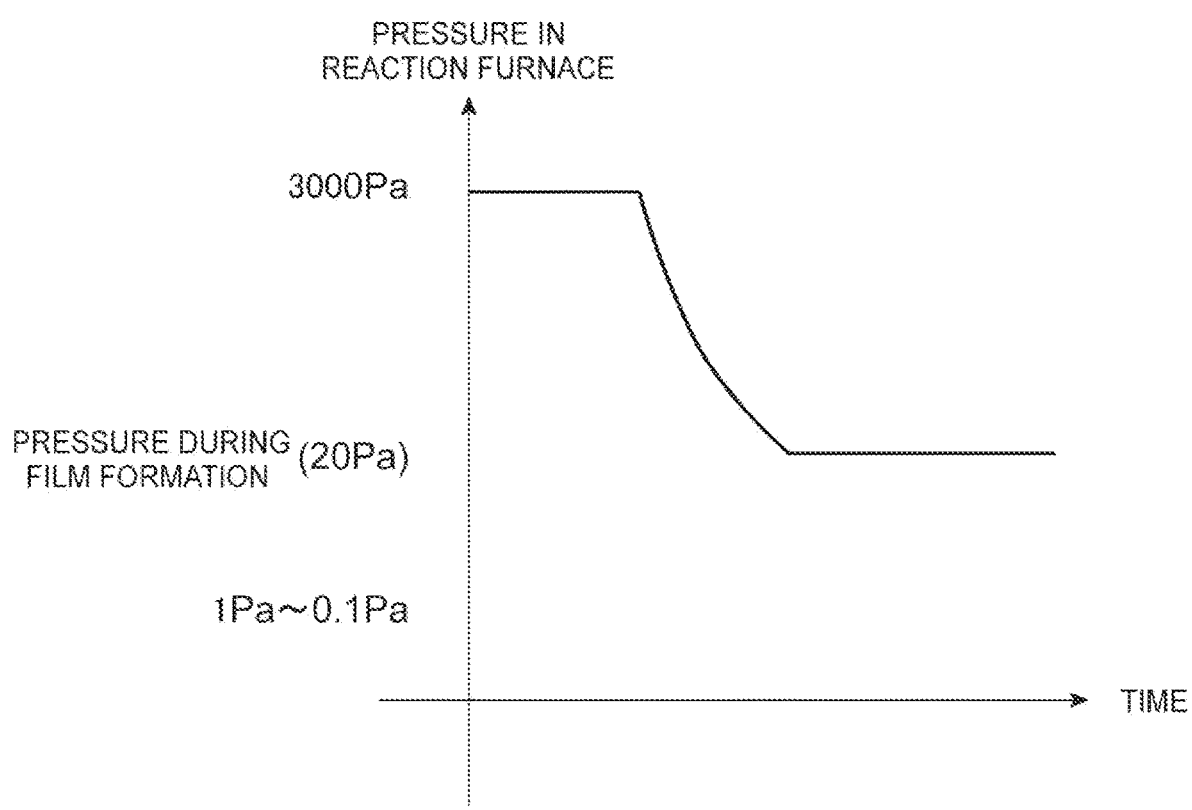
FIG. 18 is a graph showing a pressure change in the reaction furnace when the silicon nitride passivation film is formed according to the third embodiment.

On the other hand, in the third embodiment, in replacing the atmosphere in the reaction furnace before film forming (step S28), the pressure in the furnace is gradually changed (reduced) to the pressure at the time of the film forming without making vacuum as in Comparative Example 1. FIG. 18 is a graph showing a pressure change in the reaction furnace when the silicon nitride passivation film 3 is formed according to the third embodiment. In the graph of FIG. 18, the horizontal axis is time, the vertical axis is the pressure. In the third embodiment, the temperature in the reaction furnace is lowered in the temperature lowering step (step S77) immediately before step S78 and the pressure in the reaction furnace is reduced in step S78 under the control of an apparatus such as the APC. As a result, as shown in FIG. 18, the pressure reduction time is suppressed equivalent to the atmosphere replacement time of Comparative Example 1, and the extreme decrease in the equilibrium vapor pressure due to the vacuum atmosphere is suppressed, so that nitrogen atom missing can be suppressed. As a result, while suppressing the surface roughness of the nitride semiconductor layer 5 (GaN layer), it is possible to suppress the oxygen concentration increase by reducing the degassing.

Table 5 shows the results of the interfacial oxygen content when the film is formed under different pressure conditions. In Table 5, it is shown that the time for making vacuum is 0 minutes (the atmosphere in the reaction furnace is not reduced to a very low pressure) in the pressure control of the third embodiment (see FIG. 18). And in Table 5, it is shown that the time for making vacuum is from 1 minute to 10 minutes (during the time, the atmosphere in the reaction furnace is reduced to very low pressures) in the pressure control of Comparative Example 1 (see FIG. 17). From Table 5, it is found that the interfacial oxygen content can be reduced to $0.6 \times 10^{15}$ atom/cm$^2$ or less by making the time for making vacuum 5 minutes or less (if the atmosphere in the reaction furnace is reduced to a very low pressure, the time of 5 minutes or less is better). Further, from Table 5, it is found that the interfacial oxygen content can be reduced to $0.6 \times 10^{15}$ atom/cm' or less when the pressure for making vacuum is maintained 5 Pa or more. On other words, if the atmosphere in the reaction furnace is not reduced to a very low pressure, the interfacial oxygen content is lower. In short, in order to reduce the interfacial oxygen content to $0.6 \times 10^{15}$ atom/cm$^2$ or less from the viewpoint of improving the electric characteristics of the above-described semiconductor device, it is essential that the time for making vacuum is 5 minutes or less, or that the pressure for making vacuum is maintained 5 Pa or more.

TABLE 5

| ATMOSPHERE GAS | CLEANING TEMPERATURE [° C.] | CLEANING PRESSURE [Pa] | CLEANING TIME [MINUTE] | VACUUM PRESSURE [Pa] | VACUUM TIME [MINUTE] | INTERFACIAL OXYGEN CONTENT ×10$^{15}$ [atom/cm$^2$] |
|---|---|---|---|---|---|---|
| NH$_3$ | 800 | 3000 | 10 | — | 0 | 0.12 |
| NH$_3$ | 800 | 3000 | 10 | 0.5 | 1 | 0.21 |
| NH$_3$ | 800 | 3000 | 10 | 0.5 | 2 | 0.31 |
| NH$_3$ | 800 | 3000 | 10 | 0.5 | 5 | 0.49 |
| NH$_3$ | 800 | 3000 | 10 | 0.5 | 10 | 1.10 |
| NH$_3$ | 800 | 3000 | 10 | 5.0 | 10 | 0.85 |
| NH$_3$ | 800 | 3000 | 10 | 10.0 | 10 | 0.32 |

Fourth Embodiment

Figure 19:
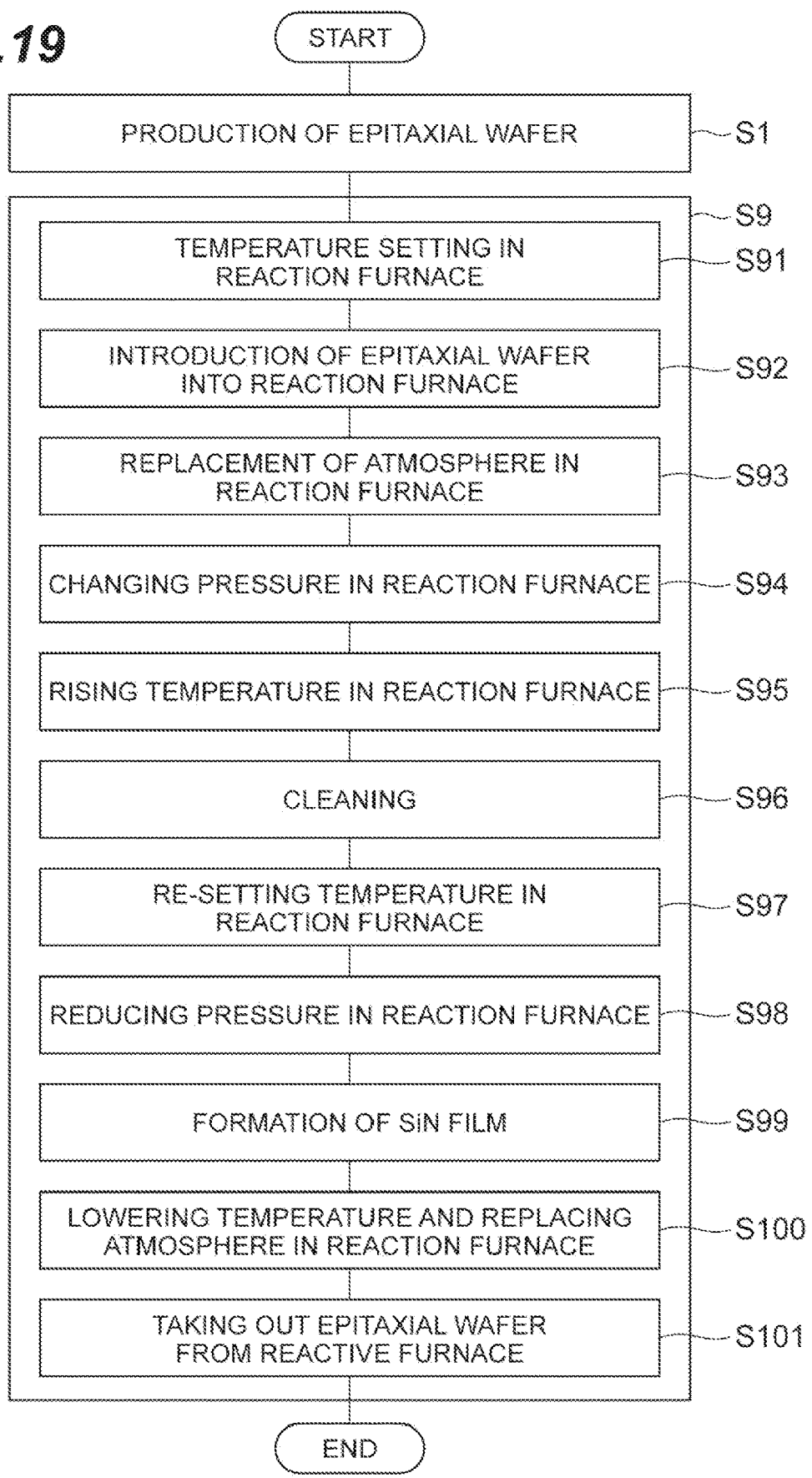
FIG. 19 is a flowchart showing a method of forming a silicon nitride passivation film according to a fourth embodiment.
Figure 20:
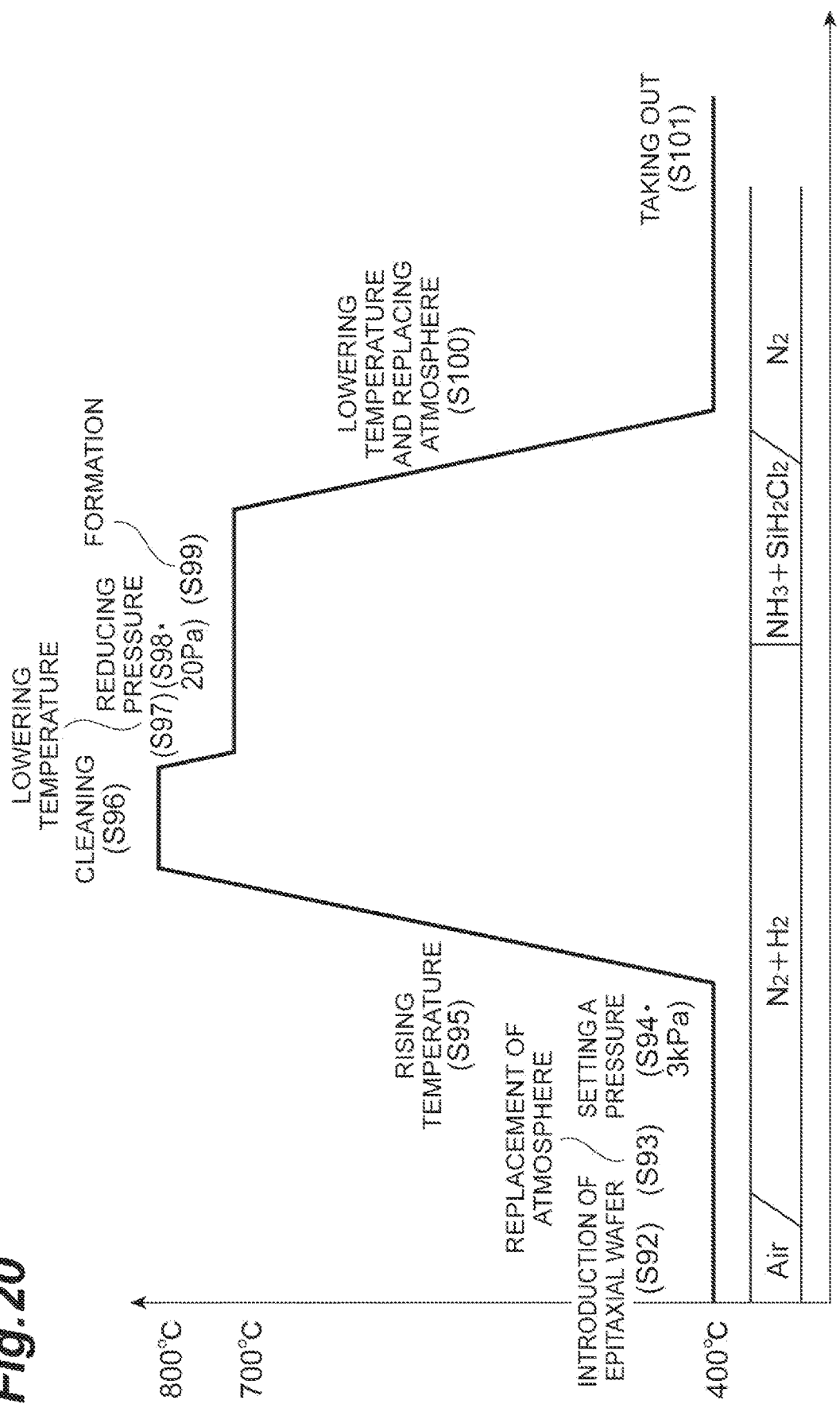
FIG. 20 is a diagram showing a control procedure of the temperature and supply gas in the reaction furnace when the silicon nitride passivation film is formed.

Next, a method of forming the silicon nitride passivation film 3 shown in FIG. 1 by the film forming method according to the fourth embodiment is described. FIG. 19 is a flowchart showing a method of forming a silicon nitride passivation film 3 according to the fourth embodiment. The film forming method according to the fourth embodiment is different from the film forming method according to the first embodiment in step S9 which is performed instead of step S2 and is otherwise the same as the film forming method according to the first embodiment. That is, in the fourth embodiment, after step S1, by performing step S9, the silicon nitride passivation film 3 is formed on the nitride semiconductor layer 5. FIG. 20 is a diagram showing the control procedure of the temperature and the supply gas in the reaction furnace when the silicon nitride passivation film 3 is formed.

In step S9, first, steps S91 and S92 are performed in this order. Steps S91 and S92 are the same as steps S21 and S22 in step S2, respectively. Next, the vacuum purging and N$_2$ purging in the reaction furnace are repeated (cycle purging), and the atmosphere is replaced with N$_2$ atmosphere (step S93). After making vacuum, the gas containing H$_2$ are introduced into the reaction furnace and the atmosphere in the reaction furnace is replaced with an atmosphere containing H$_2$. Here, as the gas containing H$_2$, the gas mixed with N$_2$ and H$_2$ is filled in the reaction furnace, and the atmosphere in the reaction furnace is set as N$_2$ and H$_2$ atmosphere. In one embodiment, H$_2$ partial pressure (H$_2$/(H$_2$+N$_2$)) is greater than or equal to 0.005 (i.e., 0.5%). Incidentally, H$_2$ partial pressure may be 5% or more.

After the cycle purge is completed, step S94 is performed. Step S94 is the same as step S24 in step S2. In step S95, the temperature in the reaction furnace is raised to a third temperature of 700° C. or higher while maintaining the pressure in the reaction furnace at the second pressure. The third temperature is higher than the film forming temperature, i.e., the second temperature. The third temperature may be a temperature 20° C. or higher than the second temperature. Further, the third temperature may be 650° C. or higher, also may be 900° C. or less. In one example, the third temperature is 800° C.

Subsequently, the inside of the reaction furnace is maintained at the third temperature (here, 800° C.) and the second pressure (here, 3 k Pa) for 3 minutes or more (step S96, a cleaning step). In one embodiment, the maintaining time is 10 minutes. Next, a film forming environment is prepared, i.e., a temperature lowering step. Specifically, the following steps S97 and S98 are performed. First, in step S97, the temperature in the reaction furnace is lowered to the second temperature for the film forming. The second temperature is a temperature lower than the third temperature. In one example, the second temperature is 700° C. After the temperature in the reaction furnace has stabilized to the second temperature, $NH_3$ gases are supplied into the reaction furnace to replace the atmosphere in the reaction furnace from the $N_2+H_2$ atmosphere to the $NH_3$ atmosphere and adjust the pressure in the reaction furnace to a third pressure of 100 Pa or less (step S98). This third pressure may be 20 Pa or less, and may also be 10 Pa or more. In one embodiment, the third pressure is 20 Pa.

Then, step S101 is performed in order from step S99. Steps S99 to S101 are the same as steps S29 to S31 in step S2, respectively. Through the above steps, the silicon nitride passivation film 3 is formed on the nitride semiconductor layer 5.

According to the film forming method of the silicon nitride passivation film 3 according to the fourth embodiment described above, the same effect as the film forming method according to the first embodiment can be obtained. Specifically, since step S96 is performed, when a silicon nitride passivation film on the nitride semiconductor is formed by the LP CVD method, it is possible to reduce the amount of oxygen at the interface between the nitride semiconductor and the silicon nitride passivation film.

Figure 21:
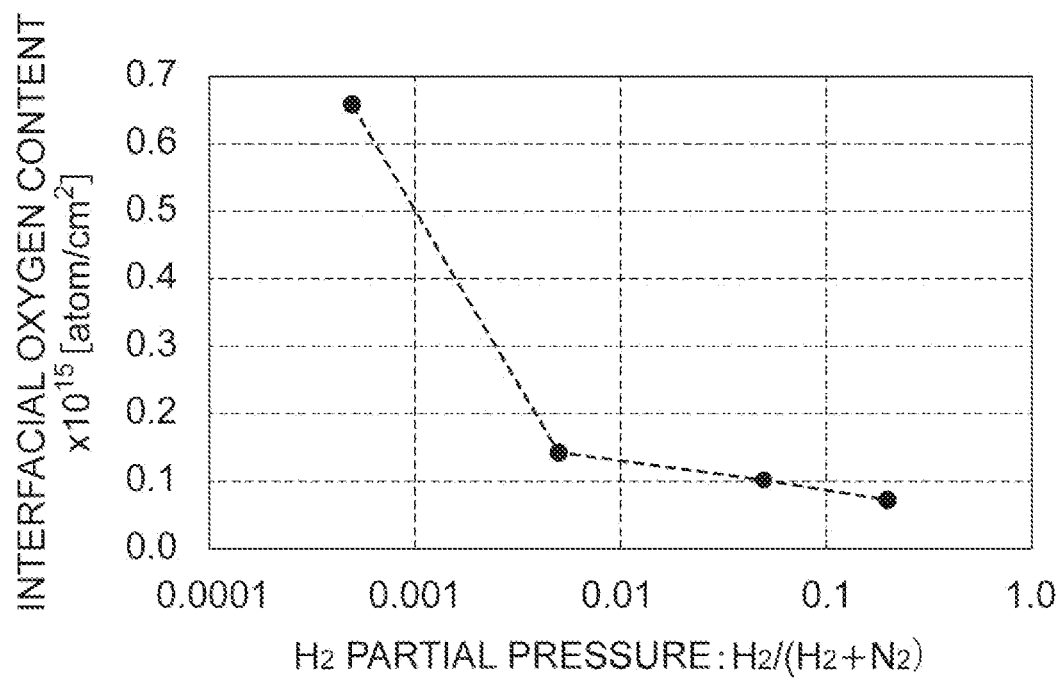
FIG. 21 is a graph showing a relationship between H$_2$ partial pressure and the interfacial oxygen content.

Table 6 and table 21 show the relationship between the $H_2$ partial pressure of atmosphere gases and the interfacial oxygen content. Table 6 shows the results of the interfacial oxygen content (the oxygen content at the interface between the nitride semiconductor layer 5 and the silicon nitride passivation film 3) in each of the cases where $H_2$ partial pressure in steps S94 to S98 is changed. FIG. 21 is a graph plotting the results of Table 6. In the graphs of FIG. 21, the horizontal axis represents $H_2$ partial pressures of the atmospheric gases, and the vertical axis represents the interfacial oxygen content.

TABLE 6

| PARTIAL PRESSURE OF $H_2$ IN ATMOSPHERE GAS | CLEANING TEMPERATURE [° C.] | CLEANING PRESSURE [Pa] | CLEANING TIME [MINUTE] | INTERFACIAL OXYGEN CONTENT ×10$^{15}$ [atom/cm$^2$] |
| --- | --- | --- | --- | --- |
| $H_2/(H_2 + N_2)$ = 0.2 | 800 | 3000 | 10 | 0.07 |
| $H_2/(H_2 + N_2)$ = 0.05 | 800 | 3000 | 10 | 0.10 |
| $H_2/(H_2 + N_2)$ = 0.005 | 800 | 3000 | 10 | 0.14 |
| $H_2/(H_2 + N_2)$ = 0.0005 | 800 | 3000 | 10 | 0.66 |

For obtaining the result of Table 6, the temperature in step S92, that is, the temperature at which the epitaxial wafer 9 is introduced into the reaction furnace is set to 400° C. In addition, the $N_2+H_2$ atmosphere is defined as the atmosphere in the reaction furnace. The pressure in the reaction furnace in steps S94 to S95 is set to 3000 Pa. In step S96, the inside of the reaction furnace is cleaned by maintaining the temperature in the reaction furnace at 800° C. and the pressure in the reaction furnace at 3000 Pa for 10 minutes. In addition, dichlorosilane is supplied into the reaction furnace at a temperature of 700° C. and a pressure of 30 Pa in the reaction furnace to form the silicon nitride passivation film 3. Referring to Table 6, it can be seen that when the $H_2$ partial pressure of the atmospheric gases is 0.005 (0.5%) or more, the interfacial oxygen content is sufficiently reduced. Further, it can be seen that the interfacial oxygen content is particularly reduced when the $H_2$ partial pressure of the ambient gas is 0.05 (5%) or more.

In the results of the above Table 6, by the $H_2+N_2$ atmosphere, as in the case where the atmosphere gas is a $NH_3$ atmosphere, it is considered that oxygen atoms 11 contained in the oxide film of the surface of the epitaxial wafer 9 are removed by hydrogen ($H_2$) reduction action. Further, it is considered that the oxygen atoms 11 contained in moisture and oxygen adhering in the reaction furnace are also removed by this reducing action. In particular, when the pressure in the reaction furnace is relatively high (e.g., when the pressure is 300 Pa or more), since the amount of hydrogen generated is relatively large, the amount of oxygen atoms 11 removed by the reduction action is also increased.

Figure 22:
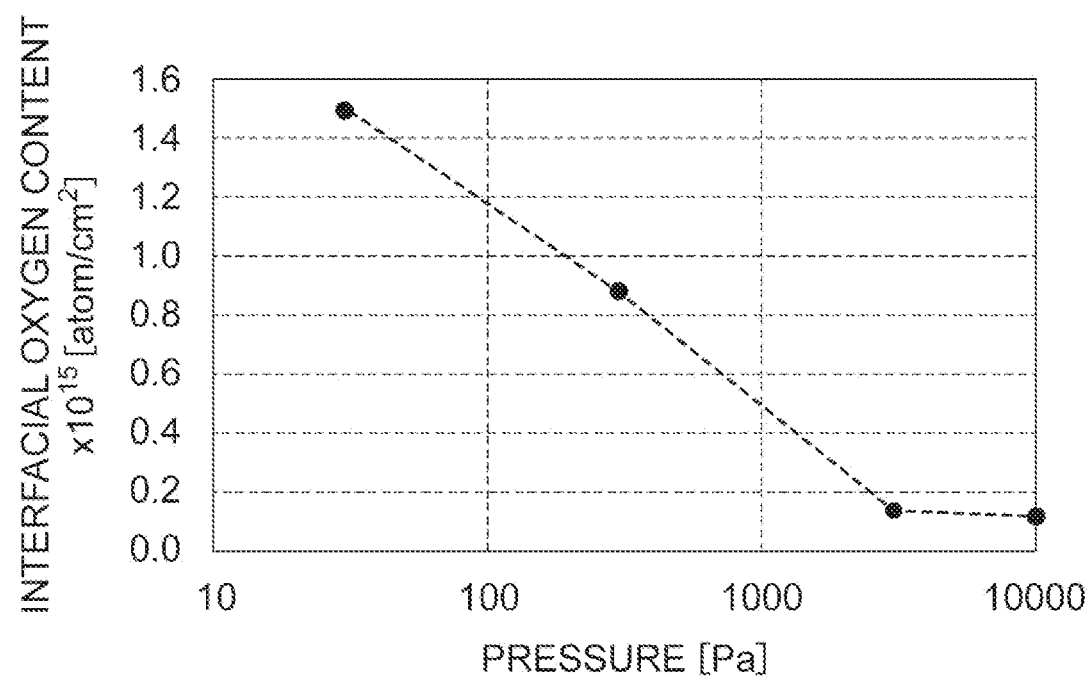
FIG. 22 is a graph showing a relationship between the pressure in the reaction furnace and the interfacial oxygen content.

Next, the film forming is performed by changing the pressure in the reaction furnace as the temperature raising condition, and the results of the interfacial oxygen content in the respective cases are described. Table 7 and FIG. 22 show the relationship between the pressure in the reaction furnace and the interfacial oxygen content. Table 7 shows the results of film forming by changing the pressure in the reaction furnace in steps S94 to S98, and comparing the interfacial oxygen content in each case. FIG. 22 is a graph plotting the results of Table 7. In the graph of FIG. 22, the horizontal axis represents the pressure in the reaction furnace, and the vertical axis represents the interfacial oxygen content. Referring to Table 7 and FIG. 22, it can be seen that the interfacial oxygen content is sufficiently reduced when the pressure in the reaction furnace is 3000 Pa or more. Further, it is understood that the interfacial oxygen content is particularly reduced when the pressure in the reaction furnace is 10000 Pa or more.

TABLE 7

| PARTIAL PRESSURE OF $H_2$ IN ATMOSPHERE GAS | CLEANING TEMPERATURE [° C.] | CLEANING PRESSURE [Pa] | CLEANING TIME [MINUTE] | INTERFACIAL OXYGEN CONTENT ×10$^{15}$ [atom/cm$^2$] |
| --- | --- | --- | --- | --- |
| $H_2/(H_2 + N_2)$ = 0.005 | 800 | 30 | 10 | 1.50 |
| $H_2/(H_2 + N_2)$ = 0.005 | 800 | 300 | 10 | 0.88 |
| $H_2/(H_2 + N_2)$ = 0.005 | 800 | 3000 | 10 | 0.14 |
| $H_2/(H_2 + N_2)$ = 0.005 | 800 | 10000 | 10 | 0.12 |

Figure 23:
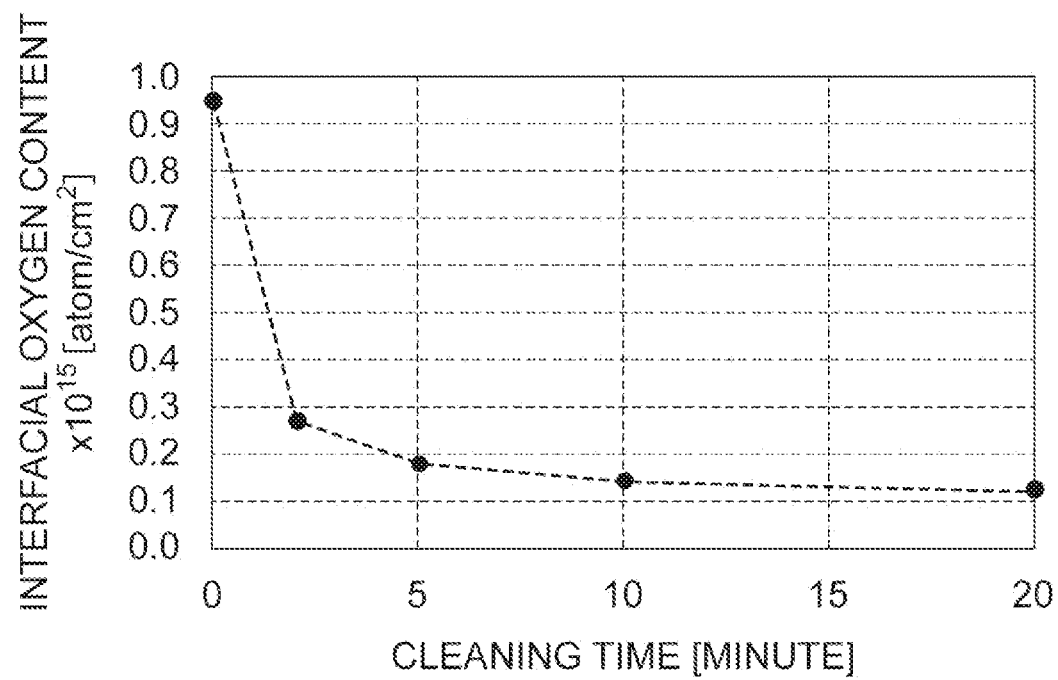
FIG. 23 is a graph showing a relationship between the cleaning time and the interfacial oxygen content.

Next, regarding results of film forming by changing the cleaning time as the cleaning condition, a description of results comparing the interfacial oxygen content in each case is given. Table 8 and FIG. 23 show the relationship between the cleaning time and the interfacial oxygen content. Table 8 shows the results of the film forming by changing the cleaning time in step S96 and comparing the interfacial oxygen content in each case. FIG. 23 is a diagram of plotting the results of Table 8. In the graph of FIG. 23, the horizontal axis represents the cleaning time, and the vertical axis represents the interfacial oxygen content. Referring to Table 8 and FIG. 23, it can be seen that the interfacial oxygen content is reduced to some extent when the cleaning time is set to 2 minutes or more. In addition, it is understood that the interfacial oxygen content is sufficiently reduced when the cleaning time is set to 5 minutes or more. Further, it is understood that the interfacial oxygen content is particularly reduced when the cleaning time is 10 minutes or more.

TABLE 8

| PARTIAL PRESSURE OF $H_2$ IN ATMOSPHERE GAS | CLEANING TEMPERATURE [° C.] | CLEANING PRESSURE [Pa] | CLEANING TIME [MINUTE] | INTERFACIAL OXYGEN CONTENT ×10$^{15}$ [atom/cm$^2$] |
|---|---|---|---|---|
| $H_2/(H_2 + N_2) = 0.005$ | 800 | 3000 | 0 | 0.95 |
| $H_2/(H_2 + N_2) = 0.005$ | 800 | 3000 | 2 | 0.27 |
| $H_2/(H_2 + N_2) = 0.005$ | 800 | 3000 | 5 | 0.18 |
| $H_2/(H_2 + N_2) = 0.005$ | 800 | 3000 | 10 | 0.14 |
| $H_2/(H_2 + N_2) = 0.005$ | 800 | 3000 | 20 | 0.12 |

Figure 24:
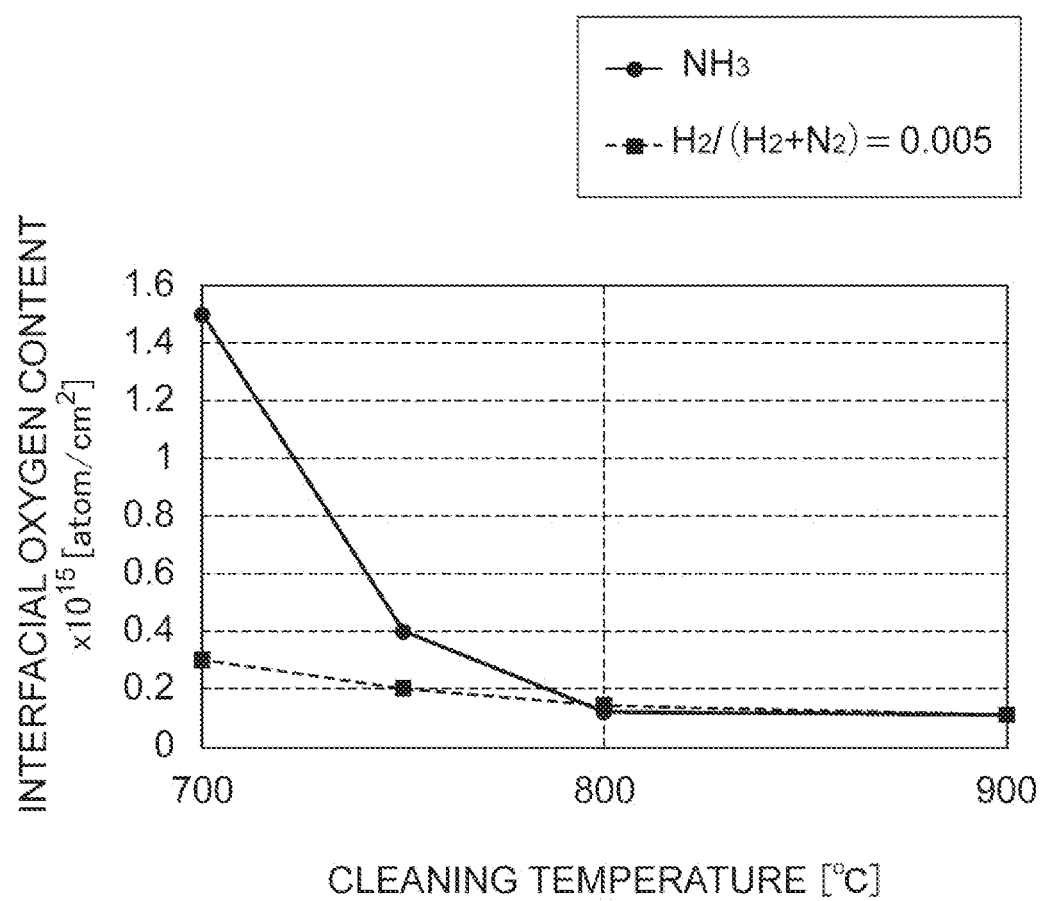
FIG. 24 is a graph showing a relationship between the cleaning time and the interfacial oxygen content.

Next, regarding the results of film forming by changing the atmosphere gas and the cleaning temperature, a description about results comparing the interfacial oxygen content in the respective cases is given. Table 9 and FIG. 24 show the relationship between the cleaning time and the interfacial oxygen content. Table 9 shows the results of film forming by changing the atmosphere gas and the cleaning temperature in steps S26 and S96, and the results of comparing the interfacial oxygen content in the respective cases. FIG. 24 is a plot of the results of Table 9. In the graph of FIG. 24, the horizontal axis represents the cleaning temperature, and the vertical axis represents the interfacial oxygen content. Referring to Table 9 and FIG. 24, it can be seen that a lower cleaning temperature reduces the interfacial oxygen content when the atmosphere gas in the reaction furnace is not the $NH_3$ atmosphere, but in the $H_2+N_2$ atmosphere.

TABLE 9

| KIND OF ATMOSPHERE GAS | PARTIAL PRESSURE OF $H_2$ IN ATMOSPHERE GAS | CLEANING TEMPERATURE [° C.] | CLEANING PRESSURE [Pa] | CLEANING TIME [MINUTE] | INTERFACIAL OXYGEN CONTENT ×10$^{15}$ [atom/cm$^2$] |
|---|---|---|---|---|---|
| $NH_3$ | | 700 | 3000 | 10 | 1.50 |
| $NH_3$ | | 750 | 3000 | 10 | 0.40 |
| $NH_3$ | | 800 | 3000 | 10 | 0.12 |
| $NH_3$ | | 900 | 3000 | 10 | 0.11 |
| $H_2 + N_2$ | $H_2/(H_2 + N_2) = 0.005$ | 700 | 3000 | 10 | 0.30 |
| $H_2 + N_2$ | $H_2/(H_2 + N_2) = 0.005$ | 750 | 3000 | 10 | 0.20 |
| $H_2 + N_2$ | $H_2/(H_2 + N_2) = 0.005$ | 800 | 3000 | 10 | 0.14 |
| $H_2 + N_2$ | $H_2/(H_2 + N_2) = 0.005$ | 900 | 3000 | 10 | 0.11 |

As described above, when the atmospheric gas is $NH_3$, it is considered that hydrogen ($H_2$) is generated by thermal decomposition, and the oxygen atoms 11 contained in the oxide film on the surface of the epitaxial wafer 9 are removed by the hydrogen reduction action. In other words, $H_2$ generated by thermal decomposition of $NH_3$ reduces the interfacial oxygen content. However, when the cleaning temperature is low, since the amount of $H_2$ generated by thermal decomposition of $NH_3$ is accordingly reduced, the reduction action described above is reduced. On the other hand, in the $H_2$ atmosphere, since $H_2$ is provided directly from the atmosphere, the same $H_2$ reduction effect can be obtained even at a lower cleaning temperature as in the $NH_3$ atmosphere. In particular, when a film is formed on a GaN layer which is a compound semiconductor, it is desirable that the film forming temperature is low from the viewpoint of nitrogen missing on the surface of the epitaxial wafer 9. Therefore, the film forming method of the silicon nitride passivation film 3 according to the fourth embodiment is more suitable when the nitride semiconductor layer 5 is a GaN layer. Further, when the cleaning temperature is 700° C. in a $H_2+N_2$ atmosphere, even if the film forming temperature and the cleaning temperature are the same, the interfacial oxygen content is sufficiently reduced. Therefore, in the cleaning step, it can be understood that a higher temperature required at supplying source gases, such as $NH_3$, is not necessary if the $H_2$ atmosphere is provided.

Further, according to the film forming method of the silicon nitride passivation film 3 according to the fourth embodiment, in step S95 from step S93, from a state where the temperature in the reaction furnace is relatively low temperature, oxidation by degassing in the reaction furnace is suppressed together, oxidation-reduction action is obtained on the surface of the epitaxial wafer 9. Therefore, when a silicon nitride passivation film on the nitride semiconductor is formed by the LP CVD method, it is possible to further reduce the amount of oxygen at the interface between the nitride semiconductor and the silicon nitride passivation film.

The method for forming a silicon nitride passivation film, the method for manufacturing a semiconductor device, and the semiconductor device according to the present disclosure are not limited to the above-described embodiments, and various other modifications are possible. For example, each of the above-described embodiments may be combined with each other according to the necessary purpose and effect. Further, the second embodiment has shown a HEMT as an example of a semiconductor device, a method of manufacturing a semiconductor device and a semiconductor device according to the present disclosure can be applied to a variety of nitride semiconductor devices other than HEMT.

Additional Note

As being appreciated from the embodiments described above, the disclosure of aspects illustrated herein below is included.

A method of forming a silicon nitride passivation film according to an embodiment of the present disclosure, a method of forming a silicon nitride passivation film on the nitride semiconductor layer, in a state where the temperature in the reaction furnace in which the substrate containing the nitride semiconductor layer is accommodated is 700° C. or higher, the pressure in the reaction furnace is maintained at 5 Pa or more, and step of performing at least one of both the change of the atmosphere in the reaction furnace and the change of the pressure in the reaction furnace, and a step of forming the silicon nitride passivation film by supplying dichlorosilane ($SiH_2Cl_2$) into the reaction furnace.

The film forming method of the silicon nitride passivation film according to one form of the present disclosure is a method of forming a silicon nitride passivation film on the nitride semiconductor layer, in a state where the temperature in the reaction furnace including the nitride semiconductor layer is 700° C. or more, the time in which the pressure in the reaction furnace becomes 5 Pa or less within 5 minutes, step of performing at least one of both the change of the atmosphere in the reaction furnace and the change of the pressure in the reaction furnace, and steps of forming the silicon nitride passivation film by supplying dichlorosilane ($SiH_2Cl_2$) into the reaction furnace.

What is claimed is:

1. A semiconductor device comprising:
   a substrate;
   a semiconductor stacking portion formed on the substrate, the semiconductor stacking portion including a plurality of nitride semiconductor layers;
   a silicon nitride passivation film covering a surface of the semiconductor stacking portion; and
   oxygen atoms existing at an interface between the silicon nitride passivation film and the semiconductor stacking portion;
   wherein an interfacial oxygen content in oxygen atoms at the interface is $0.6 \times 10^{15}$ atom/cm$^2$ or less,
   wherein the interface contains a silicon oxynitride ingredient in a Time-of-Flight Secondary Ion Mass Spectrometry (TOF-SIMS) analysis, the silicon oxynitride ingredient including the oxygen atoms, and
   wherein the silicon oxynitride ingredient has a secondary ion intensity larger than a secondary ion intensity of a gallium oxide ingredient at the interface in the TOF-SIMS analysis.

2. The semiconductor device according to claim 1, wherein the interface contains the silicon oxynitride ingredient within a range from −5 nm to +5 nm in a depth direction, when the interface is at 0 nm in the depth direction.

3. A semiconductor device comprising:
   a substrate;
   a semiconductor stacking portion formed on the substrate, the semiconductor stacking portion including a plurality of nitride semiconductor layers;
   a silicon nitride passivation film covering a surface of the semiconductor stacking portion; and
   oxygen atoms existing at an interface between the silicon nitride passivation film and the semiconductor stacking portion;
   wherein an interfacial oxygen content in oxygen atoms at the interface is $0.6 \times 10^{15}$ atom/cm$^2$ or less,
   wherein the interface contains a silicon oxynitride ingredient in a Time-of-Flight Secondary Ion Mass Spectrometry (TOF-SIMS) analysis, the silicon oxynitride ingredient including the oxygen atoms, and
   wherein the silicon oxynitride ingredient has a secondary ion intensity smaller than a secondary ion intensity of a silicon nitride ingredient at the interface in the TOF-SIMS analysis.

4. The semiconductor device according to claim 3, wherein the interface contains the silicon oxynitride ingredient within a range from −5 nm to +5 nm in a depth direction, when the interface is at 0 nm in the depth direction.

* * * * *